(12) United States Patent
Naiini et al.

(10) Patent No.: US 7,195,849 B2
(45) Date of Patent: Mar. 27, 2007

(54) PHOTOSENSITIVE RESIN COMPOSITIONS

(75) Inventors: Ahmad A. Naiini, East Greenwich, RI (US); Pamela J. Waterson, Northbridge, MA (US); William D. Weber, Rumford, RI (US); Ilya Rushkin, Walpole, MA (US); Richard Hopla, Cranston, RI (US); Jon Metivier, Billerica, MA (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/793,341

(22) Filed: Mar. 4, 2004

(65) Prior Publication Data

US 2004/0229160 A1 Nov. 18, 2004

Related U.S. Application Data

(60) Provisional application No. 60/468,526, filed on May 7, 2003, provisional application No. 60/453,757, filed on Mar. 11, 2003.

(51) Int. Cl.
*G03F 7/023* (2006.01)
*G03F 7/30* (2006.01)

(52) U.S. Cl. .................. 430/18; 430/190; 430/191; 430/192; 430/193; 430/326; 430/330

(58) Field of Classification Search .............. 430/18, 430/190, 191, 192, 193, 326, 330
See application file for complete search history.

(56) References Cited

U.S. PATENT DOCUMENTS

| | | | |
|---|---|---|---|
| 4,339,521 A | 7/1982 | Ahne et al. | 430/192 |
| 4,371,685 A | 2/1983 | Ahne et al. | 528/73 |
| 4,395,482 A | 7/1983 | Ahne et al. | 430/326 |
| 4,622,285 A | 11/1986 | Ahne et al. | 430/322 |
| 4,849,051 A | 7/1989 | Ahne et al. | 216/48 |
| 5,021,320 A | 6/1991 | Mueller et al. | 430/190 |
| 5,037,720 A | 8/1991 | Khanna | 430/190 |
| 5,077,378 A | 12/1991 | Mueller et al. | 528/185 |
| 5,096,999 A | 3/1992 | Hellmut et al. | 528/182 |
| 5,240,819 A | 8/1993 | Mueller et al. | 430/326 |
| 5,376,499 A | 12/1994 | Hammerschmidt | 430/192 |
| 5,407,780 A * | 4/1995 | Hioki et al. | 430/192 |
| 5,449,584 A | 9/1995 | Banda et al. | 430/190 |
| 5,726,279 A | 3/1998 | Sezi et al. | 528/310 |
| 5,783,654 A | 7/1998 | Sezi et al. | 528/310 |

(Continued)

FOREIGN PATENT DOCUMENTS

JP 09-146273 11/1997

(Continued)

OTHER PUBLICATIONS

Jan Rabek, Experimental Methods in Polymer Chemistry, John Wiley & Sons, New York, 1983. (This reference is a book).

(Continued)

*Primary Examiner*—John S. Chu
(74) *Attorney, Agent, or Firm*—Ohlandt, Greeley, Ruggiero & Perle, LLP

(57) ABSTRACT

A positive photosensitive resin composition comprising:
(a) at least one polybenzoxazole precursor polymer having structure I or II;

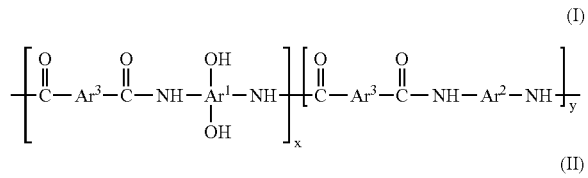

(b) at least one photosensitive compound selected from compounds described by structures III–V,

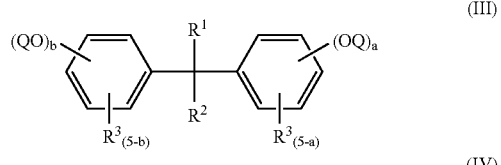

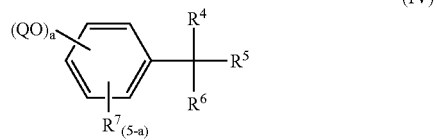

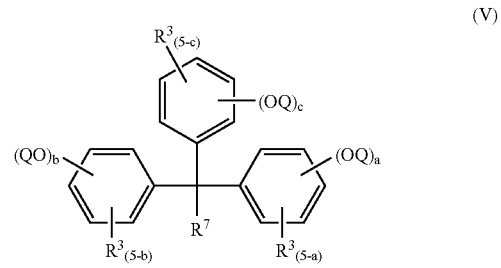

(c) at least one solvent; and
(d) optionally an adhesion promoter.

58 Claims, No Drawings

U.S. PATENT DOCUMENTS

| | | | |
|---|---|---|---|
| 5,883,221 A | 3/1999 | Sezi et al. | 528/327 |
| 5,922,825 A | 7/1999 | Sezi et al. | 528/191 |
| 5,942,369 A * | 8/1999 | Ota et al. | 430/192 |
| 5,973,202 A | 10/1999 | Sezi et al. | 564/134 |
| 6,071,666 A | 6/2000 | Hirano et al. | 430/191 |
| 6,120,970 A | 9/2000 | Sezi et al. | 430/192 |
| 6,127,086 A | 10/2000 | Waterson et al. | 430/190 |
| 6,153,350 A | 11/2000 | Sezi et al. | 430/192 |
| 6,177,225 B1 | 1/2001 | Weber et al. | 430/190 |
| 6,207,356 B1 | 3/2001 | Banda et al. | 430/326 |
| 6,235,436 B1 | 5/2001 | Hirano et al. | 430/18 |
| 6,607,865 B2 * | 8/2003 | Makabe et al. | 430/191 |
| 2004/0229167 A1 * | 11/2004 | Naiini et al. | 430/283.1 |
| 2004/0249110 A1 * | 12/2004 | Naiini et al. | 528/173 |

FOREIGN PATENT DOCUMENTS

JP        11-109635        4/1999

OTHER PUBLICATIONS

Edwin P. Plueddermann, "*Silane Coupling Agent*", 1982 Plenum Press, New York. (This reference is a book).

\* cited by examiner

PHOTOSENSITIVE RESIN COMPOSITIONS

RELATED APPLICATIONS

This application claims priority from U.S. Provisional Patent Application Nos. 60/453,757 and 60/468,526, filed Mar. 11, 2003, and May 7, 2003, respectively

FIELD OF THE INVENTION

The present invention relates to positive photosensitive resin compositions. More specifically, the present invention relates to positive-working, aqueous base developable photosensitive polybenzoxazole (PBO) precursor compositions, a process of use for said photosensitive composition, and electronic parts produced by said process of use.

BACKGROUND OF THE INVENTION

In microelectronic applications, polymers that demonstrate high temperature resistance are generally well known. Precursors of such polymers, such as polyimides and polybenzoxazoles, can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor. Positive-working photosensitive formulations based on an alkaline soluble PBO precursors capped with diazoquinone moieties and diazoquinone photoactive compounds are recently disclosed in U.S. Pat. Nos. 6,177,225 B1 and 6,127,086.

Cured PBO formulations are typically dark in color because of the myriad of high temperature reactions that take place during the high temperature cure. Unfortunately, the color of cured films of the positive photosensitive formulations is important for alignment during wire bonding and other packaging and assembly operations. Lighter-colored, more transparent films offer significant advantages in alignment during wire bonding and other packaging and assembly operations. This can result in increased throughput and accuracy. Japanese Kokai 09-146273 discloses a method to suppress such darkening in which an additional exposure step after development is employed to flood exposing the previously unexposed areas. This incurs additional costs, results in slower throughput and may affect some of the curing properties of the composition.

It is an object of this invention to provide photosensitive compositions capable of curing to high temperature resistant features, which will not substantially darken during typical cure temperatures. We have surprisingly found that positive polybenzoxazole precursor photosensitive formulations containing diazoquinone photoactive compounds which lack benzylic hydrogens on the PAC backbone yield cured films significantly lighter in color. Previous patents disclosing positive polybenzoxazole photosensitive formulations using diazoquinone photoactive compounds which lack benzylic hydrogens on the PAC backbone did not disclose any report about the color of the resulting cured films of such formulations nor how to address the problem of dark cured film in PBO formulations. Such formulations are disclosed in U.S. Pat. No. 5,376,499, U.S. Pat. No. 5,726,279, U.S. Pat. No. 5,783,654, U.S. Pat. No. 5,883,221, U.S. Pat. No. 5,922,825, U.S. Pat. No. 5,973,202, U.S. Pat. No. 6,120,970 or U.S. Pat. No. 6,153,350 herein incorporated by reference.

SUMMARY OF THE INVENTION

The present invention provides a positive photosensitive resin composition comprising:
(a) at least one polybenzoxazole precursor polymer having structure I or II;

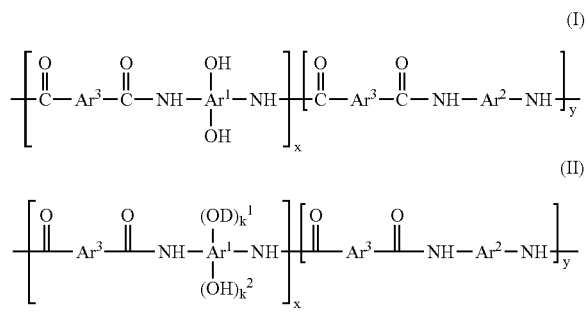

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group or a divalent aliphatic group, a divalent heterocyclic group, or mixtures thereof; D is one of the following moieties:

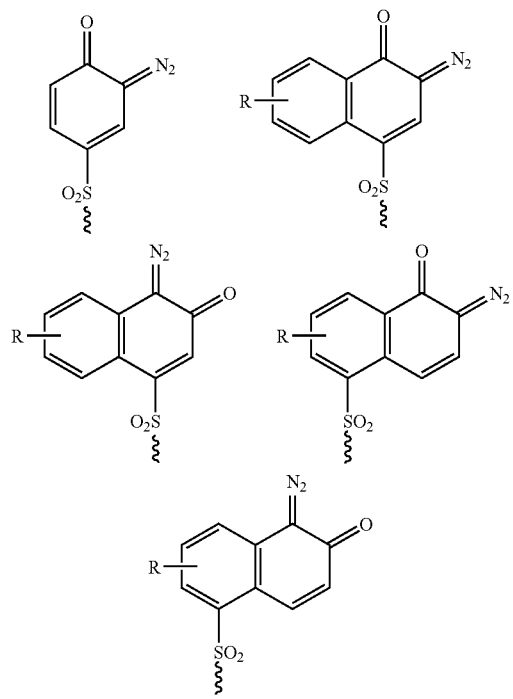

wherein R is H, halogen, a $C_1$–$C_4$ alkyl group, a $C_1$–$C_4$ alkoxy group, or a $C_5$–$C_7$ cycloalkyl group; $k^1$ can be any positive value of up to about 0.5, $k^2$ can be any value from about 1.5 to about 2, with the proviso that $(k^1+k^2)=2$, x is from about 10 to about 1000; y is from about 0 to about 900;

(b) at least one photosensitive compound selected from the group consisting of compounds described by structures III–V,

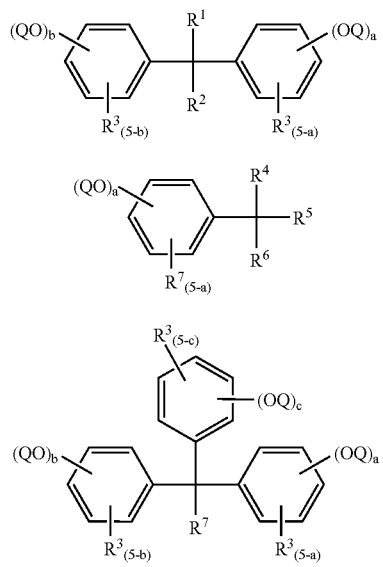

wherein $R^1$, $R^2$, $R^4$, $R^5$, $R^6$ and $R^7$ each independently are a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group or a phenyl or alkyl or halide substituted phenyl group; Q is H or D with the proviso that at least one Q=D; D is as defined hereinbefore; a is an integer from 1 to 5; b and c are integers from 0 to 5 with the provisos (1) that for Structure III, if a=b=1 and both OQ are substituted para to the $R^1R^2C$ substituent, then both $R^1$ and $R^2$ are not simultaneously methyl and (2) 1<=a+b<6; and the proviso that for Structure V, if a=b=c=1 and all OQ are para to the triphenyl methane carbon substituent, then at least one $R^3$ is not H;

(c) at least one solvent; and
(d) optionally, an adhesion promoter.

The invention further provides a process for forming a relief pattern and producing electronic parts using the photosensitive composition. The process comprises the steps of:

(a) coating on a suitable substrate, a positive-working photosensitive composition comprising at least one polybenzoxazole precursor polymer having the structure (I) or (II); at least one photosensitive compound selected from the group of compounds described by Structures II, IV or V as described before; and at least one solvent, thereby forming a coated substrate;

(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

DETAILED DESCRIPTION OF THE INVENTION

It is an object of this invention to provide photosensitive compositions capable of curing to high temperature resistant features, which will not substantially darken during typical cure conditions. We have surprisingly found that positive polybenzoxazole precursor photosensitive formulations containing diazoquinone photoactive compounds which lack benzylic hydrogens on the photoactive compound backbone yield cured films significantly lighter in color. While not wishing to be bound by this explanation, it is believed that the reactivity of benzylic hydrogens may be influenced by the presence of substituents such as hydroxyl or sulfonyl groups typically found in diazoquinone photoactive compounds during the high temperature cures and lead to darkening.

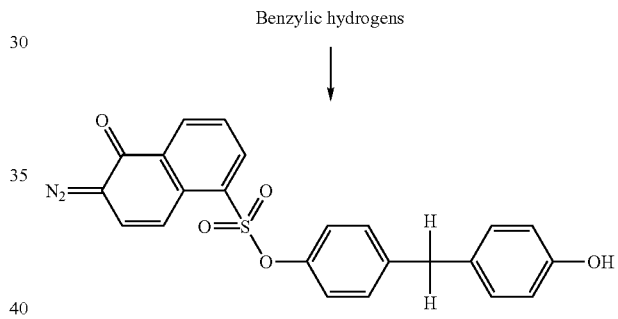

Accordingly, the present invention provides a positive photosensitive resin composition comprising:
(a) at least one polybenzoxazole precursor polymer having structure I or II;

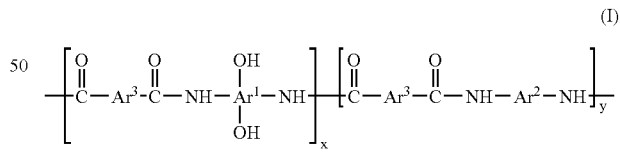

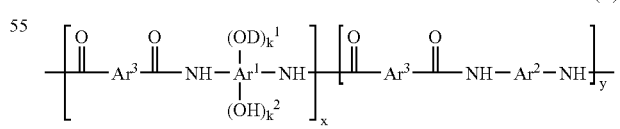

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group or a divalent aliphatic group, a divalent heterocyclic group, or mixtures thereof; D is one of the following moieties:

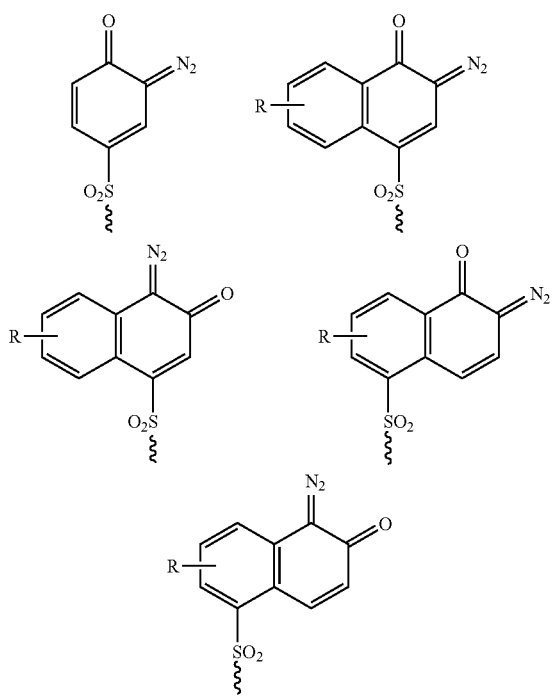

wherein, R is H, halogen, a $C_1$–$C_4$ alkyl group, a $C_1$–$C_4$ alkoxy group, or a $C_5$–$C_7$ cycloalkyl group; $k^1$ can be any positive value of up to about 0.5, $k^2$ can be any value from about 1.5 to 2 with the proviso that $(k^1+k^2)=2$, x is from about 10 to about 1000; y is from about 0 to about 900;

(b) at least one photosensitive compound selected from the group consisting of compounds described by structures III–V,

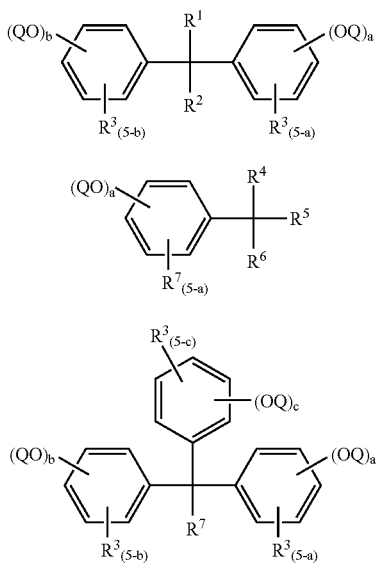

wherein $R^1$, $R^2$, $R^4$, $R^5$, $R^6$ and $R^7$ each independently are a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group or a phenyl or alkyl or halide substituted phenyl group; Q is H or D with the proviso that at least one Q=D; D is as defined hereinbefore; a is an integer from 1 to 5; b and c are integers from 0 to 5 with the provisos (1) that for Structure III, if a=b=1 and both OQ are substituted para to the $R^1R^2C$ substituent, then both $R^1$ and $R^2$ are not simultaneously methyl and (2) 1<=a+b<6; and the proviso that for Structure V, if a=b=c=1 and all OQ are para to the triphenyl methane carbon substituent, then at least one $R^3$ is not H;

(c) at least one solvent; and (d) optionally, an adhesion promoter.

The polybenzoxazole precursor polymers of Structure I may be synthesized by reaction of monomers having structures (VI), (VII), and (VIII) in the presence of a base.

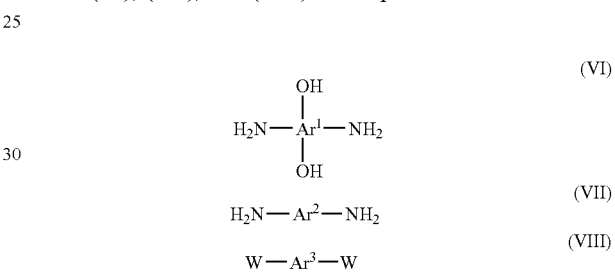

wherein $Ar^1$, $Ar^2$, $Ar^3$, x, and y are as previously defined, and W is C(O)Cl, COOH or C(O)OR$^9$, wherein $R^9$ is a $C_1$–$C_7$ linear or branched alkyl group or a $C_5$–$C_8$ cycloalkyl group.

In Structure (VI), $Ar^1$ is a tetravalent aromatic group, a tetravalent heterocyclic group, or mixtures thereof. Examples of $Ar^1$ include, but are not limited to:

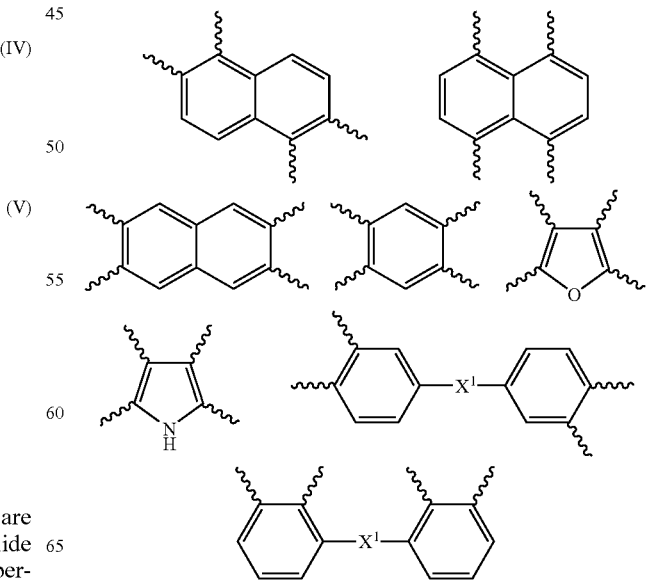

wherein $X^1$ is —O—, —S—, —C(CF$_3$)$_2$—, —CH$_2$—, —SO$_2$—, —NHCO— or —SiR$^8_2$— and each $R^8$ is independently a $C_1$–$C_7$ linear or branched alkyl or a $C_5$–$C_8$ cycloalkyl group. Examples of $R^8$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

Examples of monomers having the Structure (VI) containing $Ar^1$ include but are not limited to 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure VI may be any of the possible substitution patterns with the proviso that the each amino group has an ortho relationship with a hydroxyl group in order to be able to form the benzoxazole ring. Furthermore, the polybenzoxazole precursor polymer of Structure I may be synthesized using a mixture of two or more monomers described by Structure VI.

In Structure (VII), $Ar^2$ is a divalent aromatic, a divalent heterocyclic, a divalent alicyclic, or a divalent aliphatic group that may contain silicon. Examples of $Ar^2$ include but are not limited to:

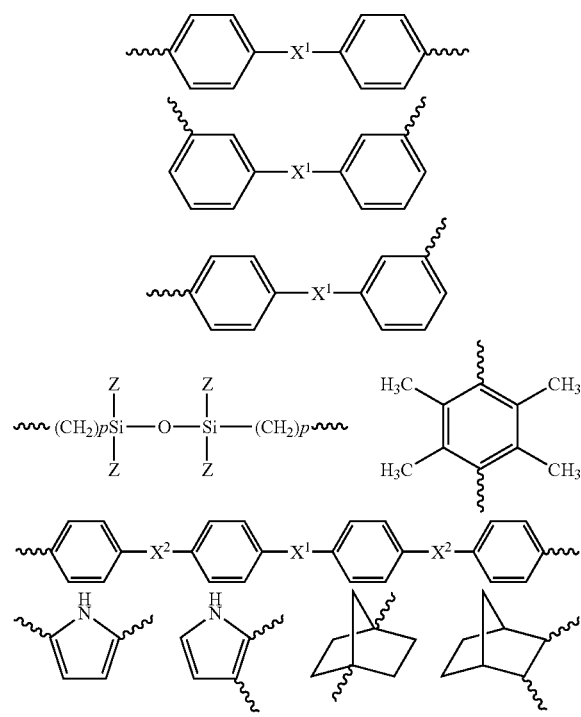

wherein $X^1$ is as defined before, $X^2$ is —O—, —S—, —C(CF$_3$)$_2$—, —CH$_2$—, —SO$_2$—, or —NHCO—; Z=H or a $C_1$–$C_8$ linear or branched alkyl group or a $C_5$–$C_8$ cycloalkyl group and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl, and cyclooctyl.

Examples of monomers having the Structure (VII) containing $Ar^2$ include, but are not limited to, 5(6)-amino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy) benzene, 1,3-bis(3-amino-phenoxy) benzene, 1,4-bis (γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl)methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thiodianiline, 4,4'-thio-bis-(2-methylaniline), 4,4'-thio-bis-(2-methyoxyaniline), 4,4'-thio-bis-(2-chloroaniline), 3,3'-sulfonyl-dianiline, and 3,3'-sulfonyl-dianiline. Furthermore, the polybenzoxazole precursor polymer of Structure I, may be synthesized using a mixture of two or more monomers described by Structure VII.

In Structure (VIII), $Ar^3$ is a divalent aromatic group, a divalent aliphatic group, a divalent heterocyclic group, or mixtures thereof. Examples of $Ar^3$ include, but are not limited to:

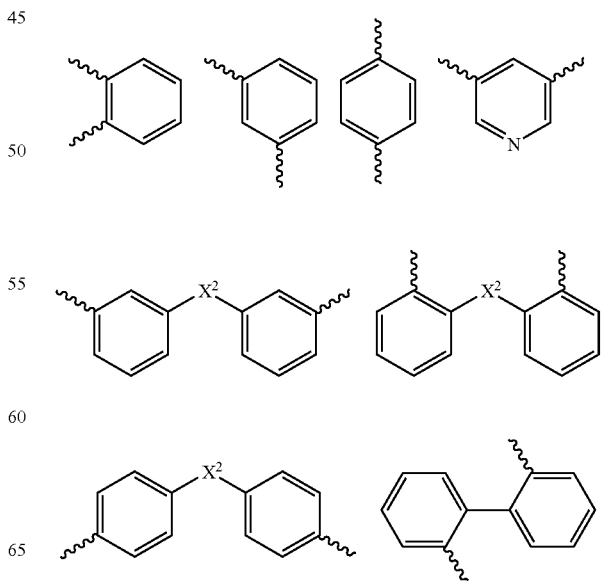

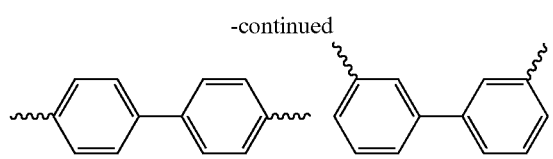

wherein $X^2$ is —O—, —S—, —C(CF$_3$)$_2$—, —CH$_2$—, —SO$_2$—, or —NHCO—.

In Structure (VIII), W is C(O)Cl, COOH or C(O)OR$^9$ wherein —R$^9$ is a C$_1$–C$_7$ linear or branched alkyl group or a C$_5$–C$_8$ cycloalkyl group. Examples of R$^9$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl. Monomers having the Structure VIII are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=C(O)Cl) include, but are not limited to, isophthaloyl dichloride, phthaloyl dichloride, terphthaloyl dichloride, 4,4'-diphenyletherdicarboxylic acid dichloride, and mixtures thereof. Examples of suitable dicarboxylic esters (W=CO$_2$R$^9$) include, but are not limited to: dimethylisophthalate, dimethylphthalate, dimethylterphthalate, diethylisophthalate, diethylphthalate, diethylterphthalate and mixtures thereof.

Polymer (I) can be synthesized by reaction of monomers (VI) and (VII) and (VIII). Any conventional method for reacting a dicarboxylic acid or its dichloride or diester with at least one aromatic and/or heterocyclic dihydroxydiamine, and optionally, with at least one diamine, may be used. Generally, the reaction for diacid chlorides (W=C(O)Cl) is carried out at about –10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor polymer of Structure I may be isolated by precipitation into water, recovered by filtration and dried. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure VI, VII, and VIII are employed such that the ratio of [(VI)+(VII)]/(VIII) is generally from about 0.9 to about 1.1. Preferably, the ratio of [(VI)+(VII)]/(VIII) is generally from about 0.92 to about 1.08. The monomer having the Structure (VI) is employed from about 10 to about 100 mole % of [(VI)+(VII)] and the monomer having Structure (VII) is employed from about 0 to about 90 mole % of [(VI)+(VII)]. Distribution of the polymeric units resulting from monomers having the Structures VI and VII in the polybenzoxazole precursor polymer (enclosed in brackets in Structures I and II), may be random or in blocks within it.

In Structures I and II, x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5. The amount of (x+y) can be calculated by dividing the numeric average molecular weight (Mn) of a polymer of Structure I or II by the average molecular weight of the repeat unit. The value of Mn can be determined by such standard methods as membrane osmometry or gel permeation chromatography as described, for example, in Jan Rabek, Experimental Methods in Polymer Chemistry, John Wiley & Sons, New York, 1983.

The resulting polybenzoxazole precursor polymer (I) can be optionally reacted with about 1–50 mole % of at least one diazoquinone (DCI) (based on the number of OH groups from the monomer of Structure VI) in the presence of a base to yield the polybenzoxazole precursor polymer of Structure (11) according to reaction 1 wherein Ar$^1$, Ar$^2$, Ar$^3$, D, k$^1$, k$^2$, x and y are as previously defined. Reaction with about 1 to about 40 mole % is preferred.

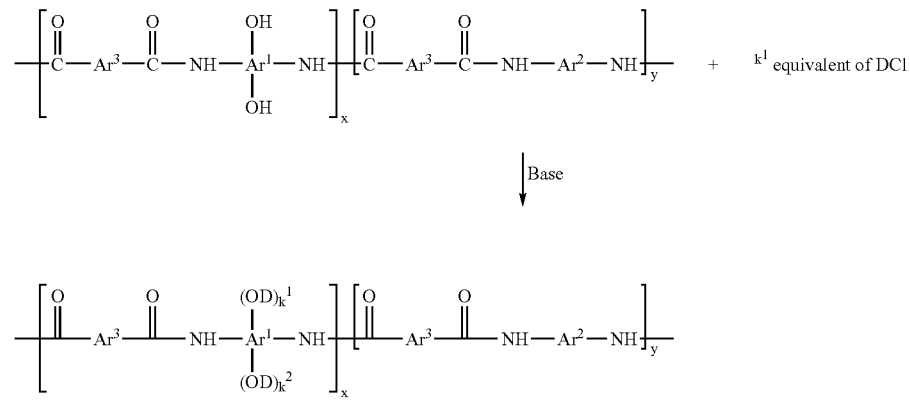

Examples of diazoquinone compounds DCI that can be reacted with the polybenzoxazole precursor polymer of Structure (I) include, but are not limited to, the following:

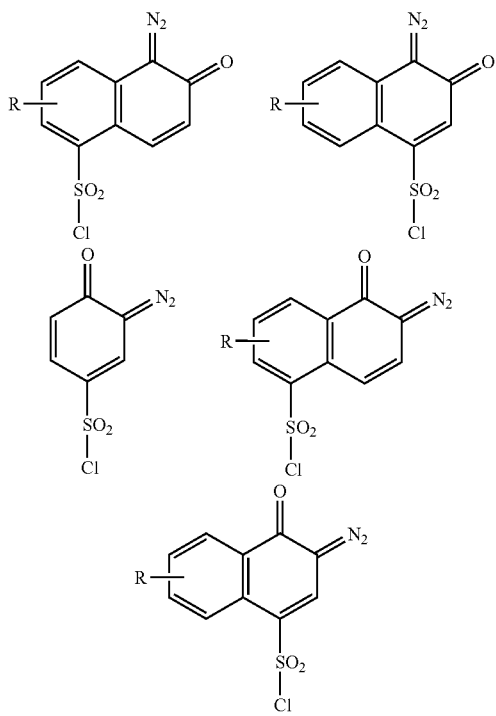

wherein R is H, a halogen, a $C_1$ to $C_4$ alkyl group, a $C_1$ to $C_4$ alkoxy group, or cyclohexyl. Examples of suitable R groups include, but are not limited to, chloro, methyl, ethyl, isopropyl, n-propyl, n-butyl, iso-butyl and sec-butyl, methoxy, ethoxy, n-propoxy, iso-propoxy, n-butoxy, cyclopentyl or cyclohexyl. Preferred DCI are

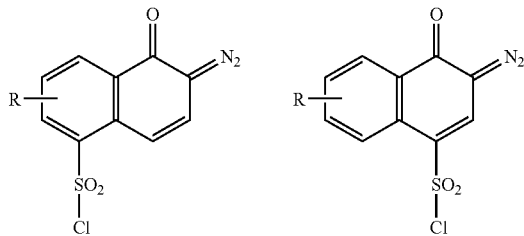

and most preferred DCI are the same moieties where R=H.

Generally, the reaction is carried out at about 0° C. to about 30° C. for about 3 to about 24 hours in a solvent in the presence of a base. Generally, a slight excess of base to DCI is employed. Examples of bases include but are not limited to amine bases such as pyridine, trialkylamine, methylpyridine, lutidine, n-methylmorpholine, and the like. The most preferred base is triethylamine. The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, diglyme and tetrahydrofuran (THF). The most preferred solvents are tetrahydrofuran (THF) and gamma-butyrolactone (GBL). The reaction mixture should be protected from actinic rays.

The molar amount of DCI may range from about 1% to about 50% of the quantity of OH groups from monomers of Structure VI to yield $k^1$ from about 0.01 to about 0.5. A preferred amount of DCI is from about 1% to about 40% of the quantity of OH groups from monomers of Structure VI to produce $k^1$ from about 0.01 to about 0.40. A more preferred amount of DCI is from about 1% to about 10% of the quantity of OH groups from monomers of Structure VI to produce $k^1$ from about 0.01 to about 0.10. A most preferred amount of DCI is from about 1% to about 5% of the quantity of OH groups from monomers of Structure VI to produce $k^1$ from about 0.01 to about 0.05.

The photoactive composition of the invention further comprises at least one photoactive compound selected from the group of compounds described by structures III, IV and V.

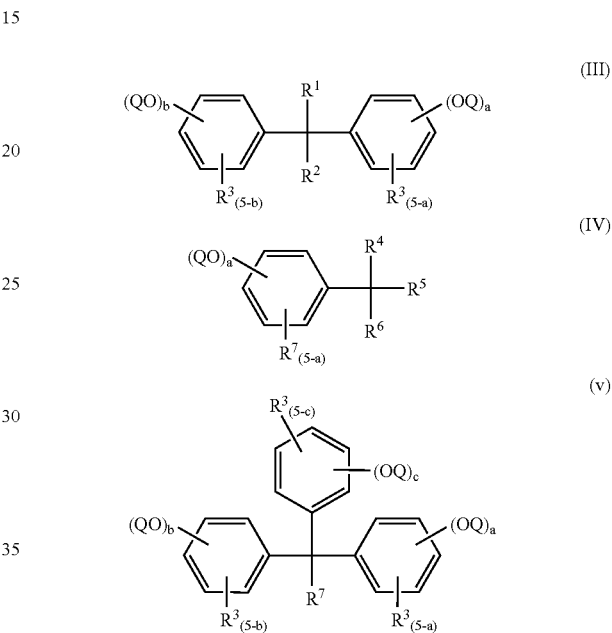

wherein $R^1$, $R^2$, $R^4$, $R^5$, $R^6$ and $R^7$ each independently are a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group or a phenyl or alkyl or halide substituted phenyl group; Q is H or D with the proviso that at least one Q=D; a is an integer from 1 to 5; b and c are integers from 0 to 5 with the provisos (1) that for Structure III, if a=b=1 and both OQ are substituted para to the $R^1R^2C$ substituent, then both $R^1$ and $R^2$ are not simultaneously methyl and (2) 1<=a+b<6; and the proviso that for Structure V, if a=b=c=1 and all OQ are para to the triphenyl methane carbon substituent, then at least one $R^3$ is not H.

Examples of suitable $R^1$, $R^2$, $R^3$, $R^4$, $R^5$, $R^6$ and $R^7$ groups include, but are not limited to, methyl, ethyl, isopropyl, tert-butyl, 2-phenylpropyl, 1-methyl-1-phenylethyl, trifluoromethyl, trifluoroethyl, 3-chloropropyl, cyclopentyl, cyclohexyl, 2-methylcyclopentyl and 3-chlorocyclohexyl. Examples of $R^1$ and $R^2$ or any two of $R^4$, $R^5$, and $R^6$ forming a 5–7 membered ring include but are not limited to cyclopentylene and cyclohexylene. Additional suitable examples of R³ include, but are not limited to, phenyl, biphenyl, 4-chlorophenyl, 2-ethyl phenyl, and 2,4,6-trimethyl phenyl.

In Structures III–V, Q is H or D wherein D is one of the following moieties:

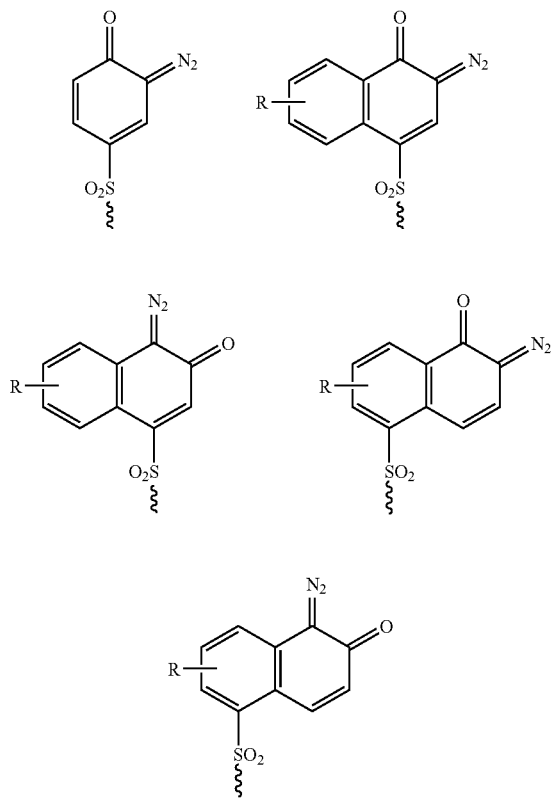

The preferred Ds are

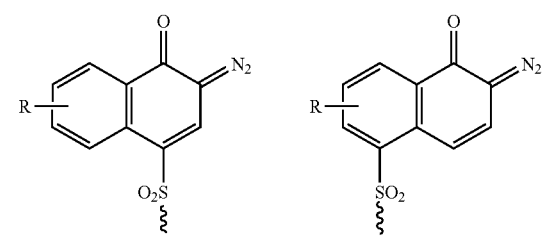

The most preferred D is

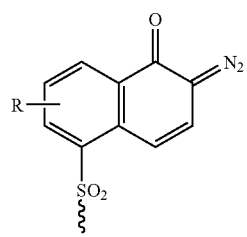

wherein R is H, a halogen, a $C_1$–$C_4$ alkyl group, a $C_1$–$C_4$ alkoxy group, or a $C_5$–$C_7$ cycloalkyl group. Examples of suitable R groups include but are not limited to chloro, methyl, ethyl, isopropyl, n-propyl, n-butyl, iso-butyl, sec-butyl, methoxy, ethoxy, n-propoxy, iso-propoxy, n-butoxy, cyclopentyl or cyclohexyl.

Preferred examples of compounds described by Structures III, IV, and V include, but are not limited to:

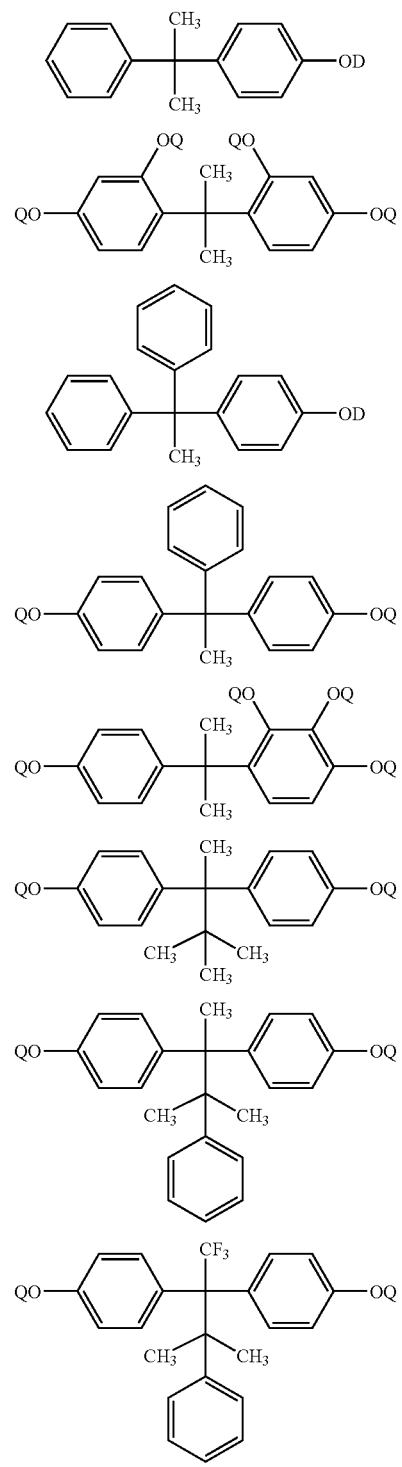

-continued
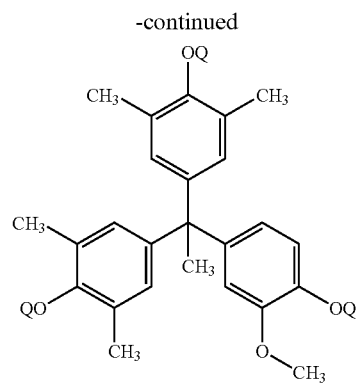
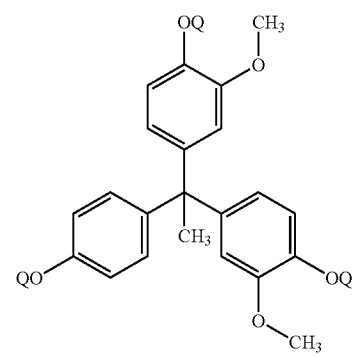
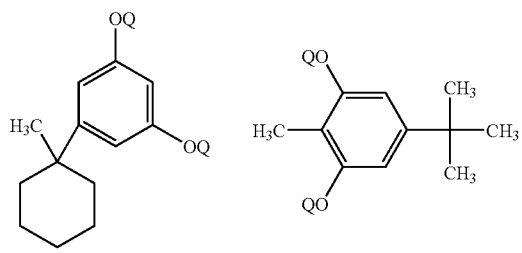
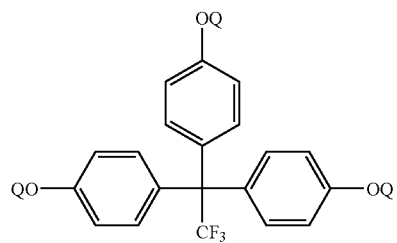
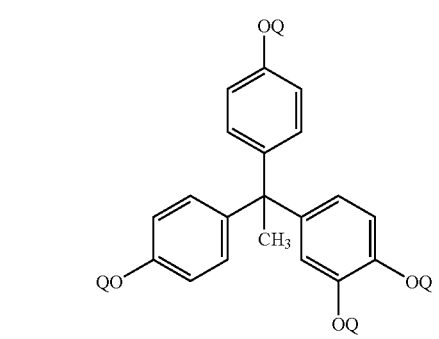
-continued
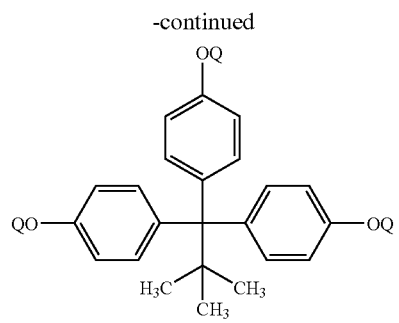
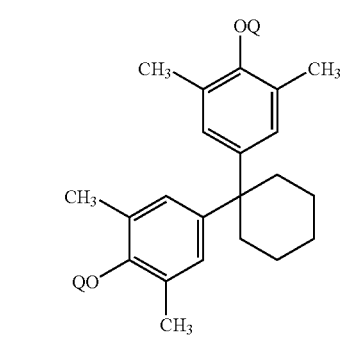
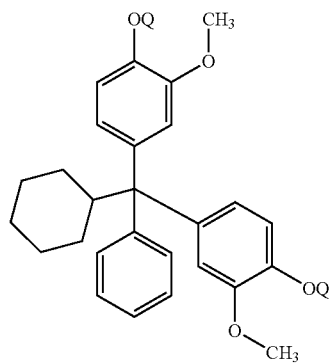
where the definition of Q and D are as previously described.
The most preferred examples of compounds described by Structures
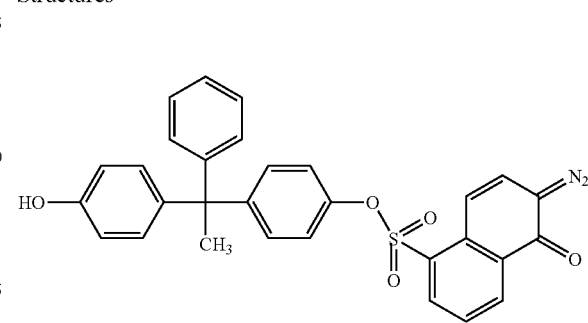

III, IV, and V include, but are not limited to:

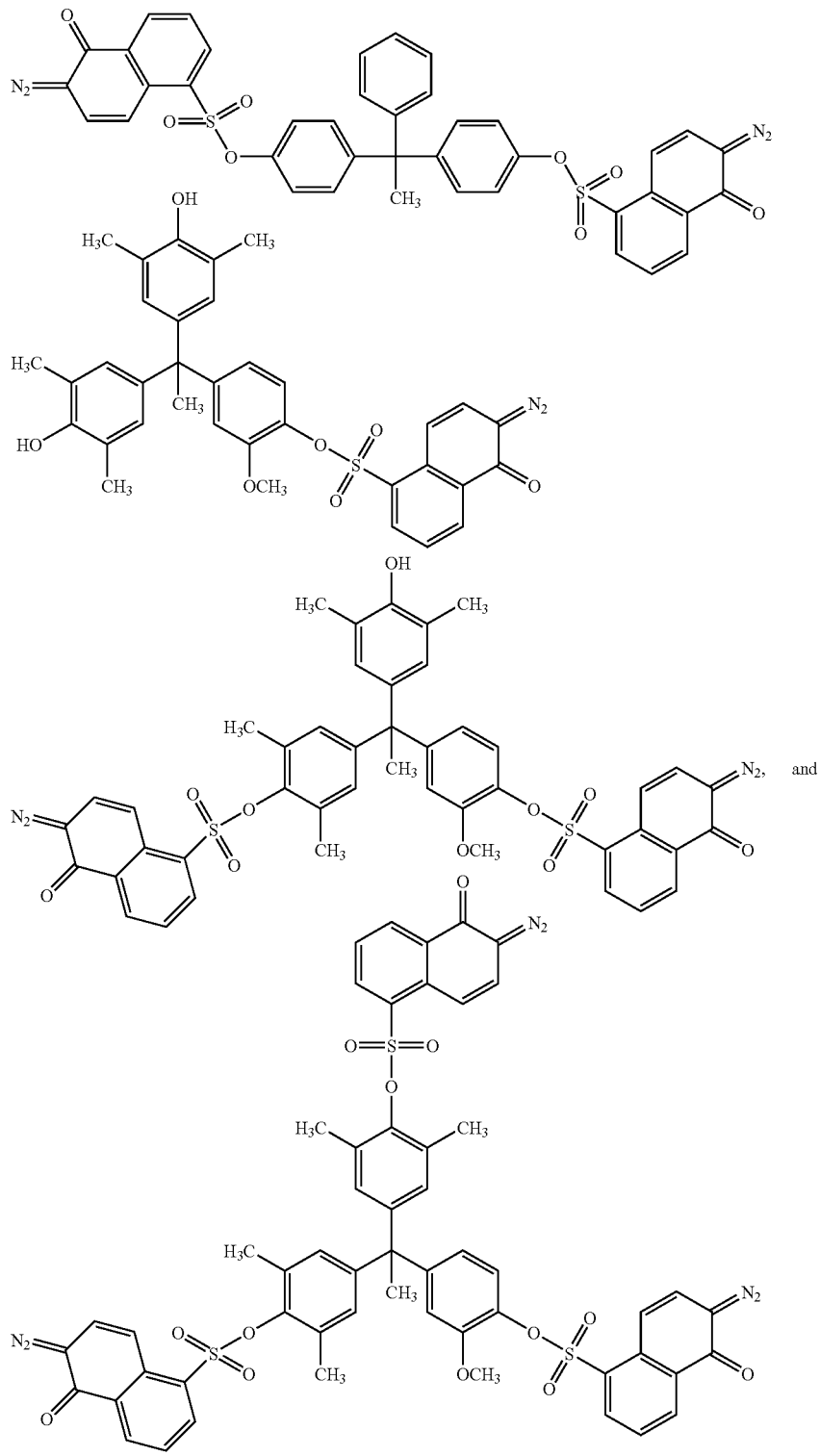

The phenolic compounds typically employed in the preparation of a photoactive compound (i.e. the backbone) may be prepared by any suitable method. A common method of syntheis is by reaction of a suitable phenol derivative with a suitable aldehyde or ketone in the presence of a solvent such as methanol. The reaction is most often catalyzed by a strong acid (e.g. sulfuric acid or p-toluene sulfonic acid). Generally, the reaction is carried out at about 15° C. to about 80° C. for about 3 hours to about 48 hours. The photoactive compounds are synthesized by reaction of the backbone with DCI. Generally, the reaction is carried out at about 0° C. to about 30° C. for about 4 to about 36 hours in a solvent in the presence of a base. Generally, a slight excess of base to DCI is employed. Examples of bases include but are not limited to amine bases such as pyridine, trialkylamine, methylpyridine, lutidine, n-methylmorpholine, and the like. The most preferred base is triethylamine. The preferred reaction solvents are tetrahydrofuran (THF), gamma-butyrolactone (GBL), N,N-dimethylformamide (DMF), acetone, N,N-dimethylacetamide (DMAc), dimethyl-2-piperidone, dimethylsulfoxide (DMSO), sulfolane, and diglyme. The most preferred solvents are tetrahydrofuran (THF), acetone and gamma-butyrolactone (GBL). The reaction mixture should be protected from actinic rays.

The molar amount of DCI may range from about 25% to about 100% of the quantity of OH groups in the backbone of photoactive compound. A preferred amount of DCI is from about 40% to about 98% of the quantity of OH groups in the backbone of photoactive compound. A more preferred amount of DCI is from about 50% to about 98% of the quantity of OH groups in the backbone of photoactive compound.

The positive acting, photosensitive composition of this invention further comprises at least one solvent. Suitable solvents include, but are not limited to, organic solvents, such as N-methylpyrrolidone (NMP), gamma-butyrolactone (GBL), N,N-dimethylacetamide (DMAc), dimethyl-2-piperidone, N,N-dimethylformamide (DMF), and mixtures thereof. The preferred solvents are gamma-butyrolactone and N-methylpyrrolidone. The most preferred solvent is gamma-butyrolactone.

The positive photosensitive resin composition of this invention comprises at least one polybenzoxazole precursor polymer of Structure (I) or (II) at from about 5 wt. % to about 50 wt. % of the total composition. A more preferred amount of polybenzoxazole precursors (I) or (II) is from about 10 wt % to about 45 wt %. A more preferred amount of polybenzoxazole precursors (I) or (II) is from about 15 wt % to about 43 wt %. The most preferred amount of polybenzoxazole precursors (I) or (II) is from about 20 wt % to about 40 wt %.

The polybenzoxazole precursor polymers used in the photosensitive composition may comprise the polybenzoxazole precursor polymer described by Structure I, the polybenzoxazole precursor polymer described by Structure II, or mixtures thereof. Polymers described by Structures I and II can be blended in any ratio. Preferred photosensitive compositions comprise those employing a mixture of at least one polybenzoxazole precursor polymer described by Structure I with at least one polybenzoxazole precursor polymer described by Structure II or at least one polybenzoxazole precursor polymer described by Structure II. More preferred photosensitive compositions employ only at least one polybenzoxazole precursor polymer described by Structure II.

The amount of photosensitive compound described by Structures III, IV and V used in the composition of this invention is from about 1 wt. % to about 20 wt. % of the total weight of the composition, preferably, about 2 wt. % to about 10 wt. %, and most preferably, about 3 wt. % to about 5 wt. %. Diazoquinone compounds III, IV and V may be blended together in any suitable ratio.

Solvent comprises about 40 wt. % to about 80 wt. % of the photosensitive composition. A preferred solvent range is from about 45 wt. % to about 70 wt. %. A more preferred range of solvent is from about 50 wt. % to about 65 wt. %.

Optionally, an adhesion promoter may be included in the photosensitive composition. If employed, the amount of adhesion promoter ranges from about 0.1 wt. % to about 2 wt. %. A preferred amount of adhesion promoter is from about 0.2 wt. % to about 1.5 wt. %. A more preferred amount of adhesion promoter is from about 0.3 wt. % to about 1 wt. %. Suitable adhesion promoters include, for example, amino silanes, and mixtures or derivatives thereof. Examples of suitable adhesion promoters which may be employed in the invention may be described by Structure IX

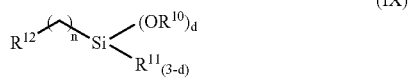

wherein each $R^{10}$ is independently a $C_1$–$C_4$ alkyl group or a $C_5$–$C_7$ cycloalkyl group and each $R^{11}$ is independently a $C_1$–$C_4$ alkyl group, a $C_1$–$C_4$ alkoxy group, a $C_5$–$C_7$ cycloalkyl group or a $C_5$–$C_7$ cycloalkoxy group; d is an integer from 0 to 3 and n is an integer from 1 to about 6. $R^{12}$ is one of the following moieties:

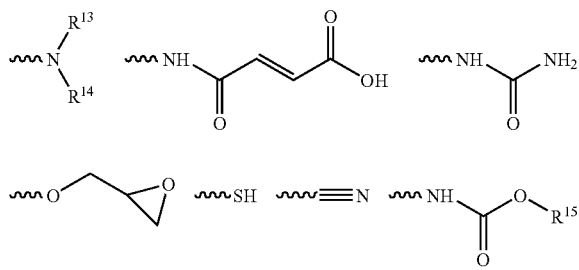

wherein each $R^{13}$ and $R^{14}$ are independently a $C_1$–$C_4$ alkyl group or a $C_5$–$C_7$ cycloalkyl group, and $R^{15}$ is a $C_1$–$C_4$ alkyl group and a $C_5$–$C_7$ cycloalkyl group. Preferred adhesion promoters are those wherein $R^{12}$ are

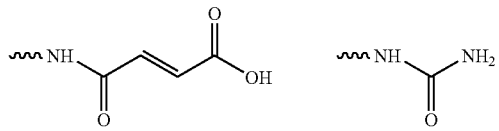

More preferred adhesion promoters are those wherein $R^{12}$ is

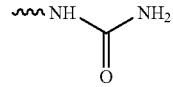

The most preferred adhesion promoters are

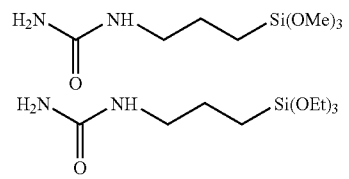

The photosensitive compositions of the present invention may further include other additives. Suitable additives include, for example, leveling agents, dissolution inhibitors and the like. Such additives may be included in the photosensitive compositions in about 0.1–10 wt % of the sum of the weights of photoactive agent and polybenzoxazole precursor polymers I and II.

Furthermore, the present invention concerns a process for forming a relief pattern and electronic parts using the photosensitive composition. The process comprises the steps of:
(a) coating on a suitable substrate, a positive-working photosensitive composition comprising at least one polybenzoxazole precursor polymer having the structure (I) or (II); at least one photosensitive compound selected from the group of compounds described by Structures III, IV or V as described before; and at least one solvent, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

To ensure proper adhesion of the photosensitive composition to the substrate the substrate may be optionally treated with an (external) adhesion promoter before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxalkoxyysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxy-silane, gamma-glycidoxypropylmethyldimethoxysilane, gamma-glycidoxypropylmethyld iethoxysilane, gamma-mercaptopropylmethyldimethoxysilane, 3-methacryloxypropyldimethoxymethylsilane, and 3-methacryloxypropyltrimethoxysilane gamma-Aminopropyltrimethoxysilane is more preferred. Additional suitable adhesion promoters are described in "Silane Coupling Agent" Edwin P. Plueddemann, 1982 Plenum Press, New York. The process may optionally include the step of post exposure baking the exposed coated substrate at an elevated temperature, prior to developing. Still another optional step is rinsing the developed substrate, prior to curing.

The positive acting, photoactive resin of this invention is coated on a suitable substrate. The substrate may be, for example, semiconductor materials such as a silicon wafer or a ceramic substrate, glass, metal, or plastic. Coating methods include, but are not limited to spray coating, spin coating, offset printing, roller coating, screen printing, extrusion coating, meniscus coating, curtain coating, and immersion coating. The resulting film is prebaked at an elevated temperature. The bake may be completed at one or more temperatures within the temperature bake of from about 70° C. to about 120° C. for about several minutes to about half an hour, depending on the method, to evaporate the remaining solvent. Any suitable baking means may be employed. Examples of suitable baking means include, but are not limited to, hot plates and convection ovens. The resulting dry film has a thickness of from about 3 to about 20 micron or more preferably from about 4 to about 15 micron or most preferably from about 5 to about 10 micron.

After the bake step, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, in an optional step it may be advantageous to heat the exposed and coated substrate to a temperature between about 70° C. and 120° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g., diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to 40° C. for about 30 seconds to about 5 minutes. After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at or above the glass transition temperature $T_g$ of the photosensitive composition to obtain the benzoxazole ring that provides high heat resistance. Typically, temperatures above about 200° C. are used.

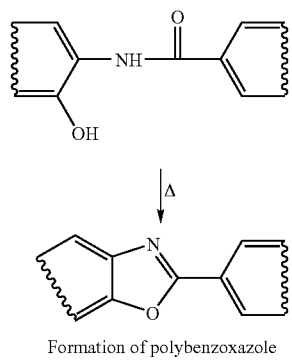

Formation of polybenzoxazole

Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate or in a convection oven.

In addition, the present invention includes electronic parts obtained by using the invention composition.

To illustrate the present invention, the following examples are provided. It should be understood that the present invention is not limited to the examples described.

SYNTHESIS EXAMPLE 1

Preparation of Polybenzoxazole Precursor Polymer of Structure Ia

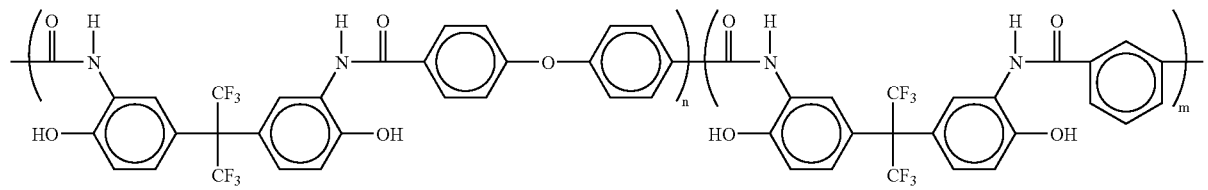

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids dissolved and then cooled in an ice water bath at 0–5° C. To this solution, 1.01 g (5 mmol) of isophthaloyl chloride and 1.477 g (5 mmol) of 1,4-oxydibenzoyl chloride dissolved in 10 g of NMP was added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50150) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

SYNTHESIS EXAMPLE 2

Preparation of Polybenzoxazole Precursor Polymer of Structure Ia Having Alternate Monomer Ratios Synthesis Example 1 was repeated except the molar ratio of diacid dichloride mixture was reduced from 1:1 to 0.91:1. The inherent viscosity of the polymer was 0.23 dL/g measured in NMP at the concentration of 0.5 g/dL at 25° C.

SYNTHESIS EXAMPLE 3

Preparation of Polybenzoxazole Precursor Polymer of Structure IIa

To a 100 mL three-necked round bottom flask equipped with a mechanical stirrer, 5.42 g (10.0 mmol) of the polymer obtained in Synthesis Example 1 and 50 mL of tetrahydrofuran (THF) were added. The mixture was stirred for ten minutes and the solid was fully dissolved. 0.81 g (3 mmole) of 2,1-naphthoquinonediazide-5-sulfonyl chloride was then added and the mixture was stirred for another 10 minutes. Triethylamine, 0.3 g (3 mmol), was added gradually within 15 minutes and then the reaction mixture was stirred for 5 hours. The reaction mixture was then added gradually to 500 mL of vigorously stirred de-ionized water. The precipitated product was separated by filtration and washed with 200 mL of de-ionized water. To the product was added another 600 mL de-ionized water and the mixture vigorously stirred for 30 minutes. After filtration the product was washed with 100 mL de-ionized water. The isolated product was dried at 40° C. overnight. The yield was 91%.

SYNTHESIS EXAMPLE 4

Preparation of Polybenzoxazole Precursor Polymer of Structure IIa Having Alternate Monomer Ratios Synthesis Example 3 was repeated except the polymer obtained in Synthesis Example 2 was reacted with 3 mole % of 2,1-naphthoquinonediazide-5-sulfonyl chloride. The inherent viscosity of the polymer was 0.21 dL/g measured in NMP at the concentration of 0.5 g/dL at 25° C.

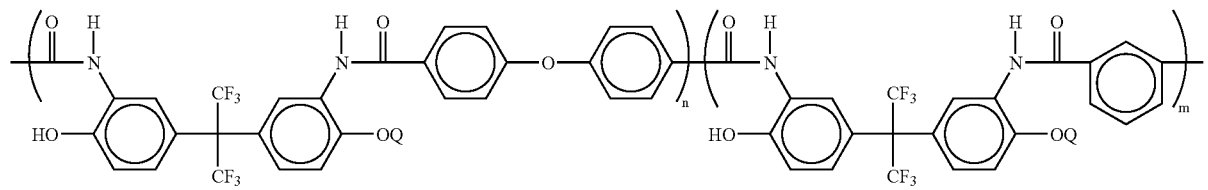

SYNTHESIS EXAMPLE 5

Synthesis of a Polybenzoxazole Precursor Polymer of Structure Ib

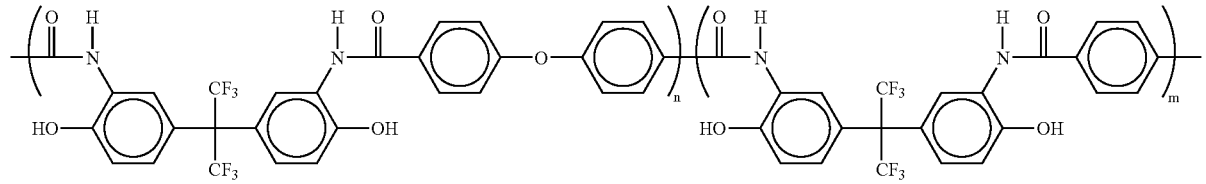

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 7250 g of N-methyl-2-pyrrolidone (NMP) were added. The solution was stirred at room temperature until all solids dissolved and then cooled in an ice water bath at 0–5° C. To this solution, 291 g g (1.43 mol) of terephthaloyl chloride and 634.5 g (2.15 mol) of 1,4-oxydibenzoyl chloride dissolved in 2760 g of NMP were added by using a diaphragm pump and Teflon transfer lines. The pump and Teflon transfer lines were cleaned using 200 g of NMP, which was then added to the solution. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and 35 L of a water/methanol (50/50) mixture. The polymer was dried under vacuum at 75° C. for 24 hours. The yield was almost quantitative and the inherent viscosity of the polymer was 0.183 dL/g measured in NMP at the concentration of 0.5 g/dL at 25° C.

SYNTHESIS EXAMPLE 6

Preparation of a Polybenzoxazole Precursor Polymer of Structure IIb

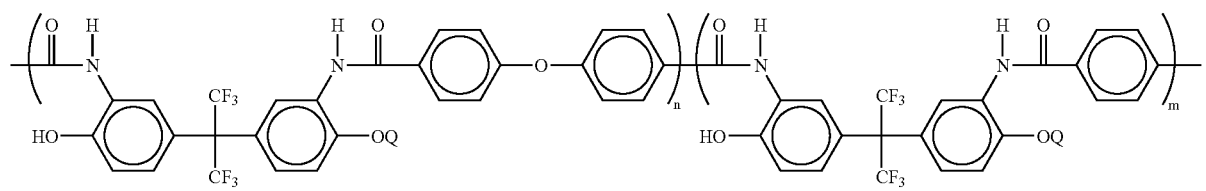

Synthesis Example 3 was repeated except the polymer from Synthesis Example 5 was employed and the ratio of 2,1-naphthoquinonediazide-5-sulfonyl chloride to the total number of OH groups of the polymer was changed to 0.02. The yield was 96% and the inherent viscosity of the polymer was 0.201 dL/g measured in NMP at the concentration of 0.5 g/dL at 25° C.

SYNTHESIS EXAMPLE 7

Preparation of a Polybenzoxazole Precursor Polymer of Structure Ic

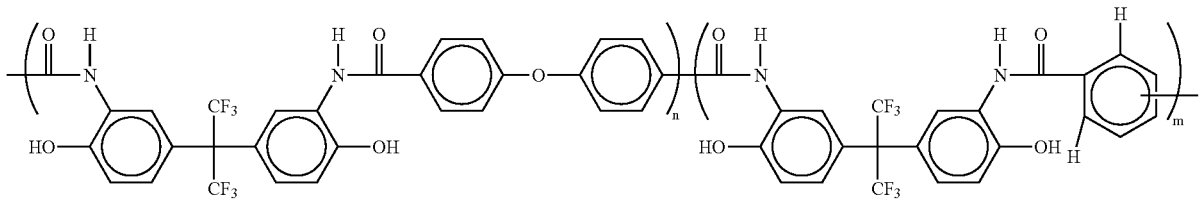

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 5000 g of N-methyl-2-pyrrolidone (NMP) were added. The solution was stirred at room temperature until all solids dissolved and then cooled in an ice water bath at 0–5° C. To this solution, 212.0 g g (1.04 mol) of terephthaloyl chloride, 212.0 g g (1.04 mol) of isophthaloyl chloride and 411.0 g (1.39 mol) of 1,4-oxydibenzoyl chloride dissolved in 2960 g of NMP were added by using a diaphragm pump and Teflon transfer lines. The pump and Teflon transfer lines were cleaned using 200 g of NMP, which was then added to the solution. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.205 dL/g measured in NMP at the concentration of 0.5 g/dL at 25° C.

SYNTHESIS EXAMPLE 8

Synthesis of a Polybenzoxazole Polymer Precursor of Structure IIc addition was completed, the resulting mixture was stirred at room temperature for 18 hours. The viscous solution was precipitated in 6.5 L of vigorously stirred de-ionized water. The polymer was collected by filtration and washed with 2×1 L of de-ionized water. The polymer was first air dried for 30 minutes before being reslurried using a mixture of 3200 ml of deionized water and 3200 ml of methanol. The polymer was collected by filtration and washed with 2×1 L of de-ionized water. Polymer was then air dried for 24 hours and then dried under vacuum at 40° C. for 60 hours. The yield was almost quantitative and the inherent viscosity of

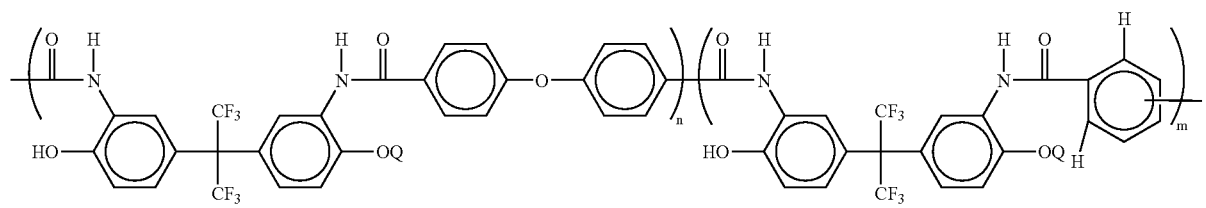

Synthesis Example 3 was repeated except the polymer from Synthesis Example 7 was employed and the ratio of 2,1-naphthoquinonediazide-5-sulfonyl chloride to the total number of OH groups of the polymer was changed to 0.025. The yield was 96% and the inherent viscosity of the polymer was 0.201. dL/g measured in NMP at the concentration of 0.5 g/dL at 25° C.

SYNTHESIS EXAMPLE 9

Preparation of Polybenzoxazole Precursor Polymer of Structure Id the polymer was 0.198 dL/g measured in NMP at the concentration of 0.5 g/dL at 25° C.

SYNTHESIS EXAMPLE 10

Synthesis of a Polybenzoxazole Polymer Precursor of Structure IId

Synthesis Example 2 was repeated except the polymer from Synthesis Example 9 was employed and the ratio of 2,1-naphthoquinonediazide-5-sulfonyl chloride to the total number of OH groups of the polymer was changed to

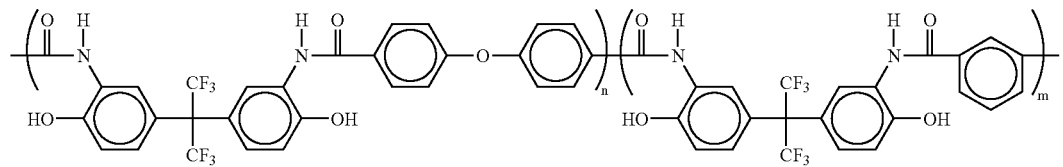

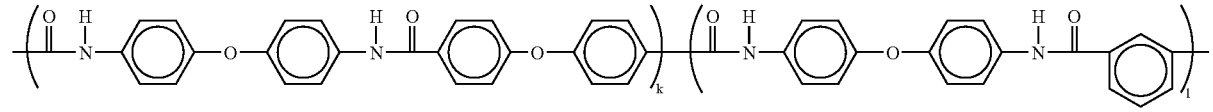

To a 1 L, three necked reaction flask equipped with a mechanical agitator, nitrogen inlet and thermometer, 69.54 g (0.1899 mol) of hexafluoro-2,2-bis(3-amino-4-hydroxyphenyl)propane, 2.0 g (0.0099 mol) of 4,4'-diaminodiphenyl ether, 30.19 g (0.3817 mol) of pyridine and 1899.85 g of N-methyl-2-pyrrolidone (NMP) were added. The solution was stirred at room temperature until all solids dissolved and then cooled in an ice water bath at −15° C. To this solution, 18.4 g (0.091 mol) of isophthaloyl chloride and 26.86 g (0.091 mol) of 1,4-oxydibenzoyl chloride dissolved in 190.3 g of NMP was added by using an addition funnel. After the 0.0222. The yield was 96% and the inherent viscosity of the polymer was 0.193 dL/g measured in NMP at the concentration of 0.5 g/dL at 25° C.

EXAMPLE 1

The following positive acting photosensitive composition was prepared: 100 parts of polymer obtained in Synthesis Example 4, 11.9 parts of bis phenol AP PAC, 5 parts of diphenylsilane diol were dissolved in GBL and filtered.

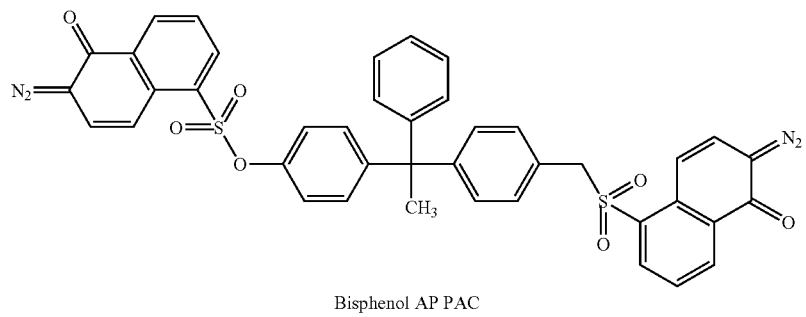

Bisphenol AP PAC 3 ml of this composition was spin coated at 2000 revolutions per minute on to a silicon wafer and then baked on a hotplate for 3 minutes at 120° C. to yield a 1.42 μm thick film. The wafer was then cured in a vacuum oven under an $N_2$ purge. The oven cure program started at 100° C. and increased at a rate of 5° C. per minute up to 350° C. The cure was held at 350° C. for 1 hour then cooled down to 100° C. over 2 hours. The cured film thickness was measured at 1.21 μm. The cured film was then lifted from the silicon wafers in boiling water. The color of this film was light yellow.

COMPARATIVE EXAMPLE 1

The following positive acting photosensitive composition was prepared: 100 parts of polymer obtained in Synthesis Example 4, 11.9 parts of PAC having structure X, 5 parts of diphenylsilane diol were dissolved in 390 parts of GBL and filtered. In Structure X, $Q^2$ is 20% H and 80% diazoquinone of the structure shown.

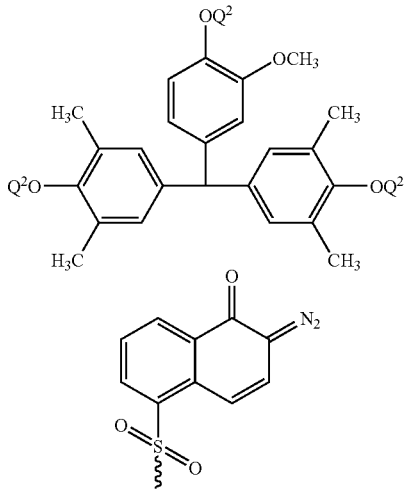

(X)

3 ml of this composition was spin coated at 2000 revolutions per minute on to silicon wafers and then baked on a hotplate for 3 minutes at 120° C. to yield a 1.51 μm thick film. The wafers were then cured in a vacuum oven under a $N_2$ purge. The oven cure program started at 100° C. and increased at a rate of 5° C. per minute up to 350° C. The cure was held at 350° C. degrees for 1 hour then cooled down to 100° C. over 2 hours. The cured film thickness was measured at 1.34 μm. The cured films were then lifted from the silicon wafers in boiling water. The color of this cured film was far darker than that of Example 1.

EXAMPLES 2–9

The following positive acting photosensitive compositions were prepared: 100 parts of polymer obtained in Synthesis Example 4, 11.9 parts of bis phenol AP PAC, 5 parts of diphenylsilane diol and 3 parts of an adhesion promoter listed in Table 1 were dissolved in 170 parts of GBL and filtered. 3 ml of each composition was spin coated at 2100 revolutions per minute on its own silicon wafer and then baked on a hotplate for 3 minutes at 120° C. to yield a 9.8 μm thick film of each composition as measured by a profilometer. The wafers were then exposed with an adhesion test mask using a Karl Suss Exposure Aligner. The mask images 4 areas that contain 100 2 mm×2 mm square pads. The coated wafers were then developed using OPD 4262, an aqueous tetramethyl ammonium hydroxide developer from Arch Chemicals. The wafers were spun at a spin speed of 500 rpm while being subjected to a developer spray for 45 seconds. The wafers were then rinsed with de-ionized water for 15 seconds, and then spun dry for 30 seconds. The wafers were then cured in a vacuum oven under an $N_2$ purge. The oven cure program started at 100° C. and increased at a rate of 5° C. per minute up to 350° C. The temperature was held at 350° C. degrees for 1 hour then decreased to 100° C. over 2 hours. All the cured films had light color. The cured wafers were placed in a pressure cooker containing one gallon of de-ionized water. The pressure cooker was heated to 121° C. (pressure was 2.05 bar) for 1700 hours. The adhesion of the material was measured at various times using the ASTM D-3359-83 Method B test. 3M Tape #681 (30 oz/inch width) was applied to the subject area covering all 100 pads. The tape was removed quickly and the material was inspected and rated 0 (worst) to 5 (best) based on the criteria outlined in ASTM D-3359-83 Method B. The results are reported in Table 1.

TABLE 1

| Ex. # | Adhesion promoter structure | Color of cured film | Rating at 336 hours | Rating at 672 hours | Rating at 1000 hours | Rating at 1700 hours |
|---|---|---|---|---|---|---|
| 2 | $H_3C\diagup O\diagup NH\diagup Si(OEt)_3$ (with C=O) | light | 5 | 5 | 5 | 5 |

TABLE 1-continued

| Ex. # | Adhesion promoter structure | Color of cured film | Rating at 336 hours | Rating at 672 hours | Rating at 1000 hours | Rating at 1700 hours |
|---|---|---|---|---|---|---|
| 3 | H₂N−C(=O)−NH−(CH₂)₃−Si(OMe)₃ | light | 5 | 5 | 5 | 5 |
| 4 | HOOC−CH=CH−C(=O)−NH−(CH₂)₃−Si(OEt)₃ | light | 5 | 5 | 5 | 5 |
| 5 | glycidoxypropyl−Si(OMe)₃ | light | 5 | 5 | 5 | NA |
| 6 | HS−(CH₂)₃−Si(OMe)₃ | light | 5 | 5 | 5 | 5 |
| 7 | N≡C−(CH₂)₂−Si(OEt)₃ | light | 5 | 5 | 5 | 5 |
| 8 | (H₃C)₂N−(CH₂)₃−Si(OMe)₃ | light | 5 | 5 | 5 | 5 |
| 9 | H₃C−CH₂−N(CH₃)−(CH₂)₃−Si(OMe)₃ | light | 5 | 5 | 5 | 5 |

These results indicated that all the compositions in Examples 2–9 had excellent adhesion when employ adhesion promoter at the level of 3% of resin and that these adhesion promoters did not affect the cure color.

COMPARATIVE EXAMPLE 2

The composition of Comparative Example 2 was identical to those of Examples 2–9 except that the adhesion promoter of Structure XI was employed. The cured film had light color. This composition was tested as described in Examples 2–9 except that the testing period was 300 hours. This composition received a rating of 0 based on the criteria outlined in ASTM D-3359-83 Method.

(XI)

This result shows that a composition containing adhesion promoter of structure XI at 3 part per 100 part of resin is not capable of passing the pressure cooker test requirement and failed after 300 hours.

EXAMPLE 10

The composition of Example 10 was identical to that of Example 4 except that only 1.5 parts of the adhesion promoter was employed. The cured film had light color. This composition was tested as described in Examples 2–9 except the test ran for 500 hours. The composition received a rating of 5 after 500 hours.

COMPARATIVE EXAMPLE 3

The composition of Comparative Example 3 was identical to those in Examples 2–9 except that an adhesion promoter of Structure XII was employed. The composition was tested using the procedure in Examples 2–9 and received a rating of 5 on the 336 hr., 672 hr., and 1000 hour tests. The cured film had light color.

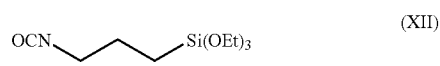
(XII)

COMPARATIVE EXAMPLE 4

The composition of Comparative Example 4 was identical to that in Example 10 except that the adhesion promoter of Structure XII was employed. The composition was tested using the procedure in Examples 2–9 and received a rating of 0 after 500 hours. The cured film had light color.

EXAMPLE 11

The composition of Example 4 was tested for stability using an accelerated aging procedure. The kinematic viscosity was measured a few minutes after filtration. After standing for 24 hours at room temperature the kinematic viscosity was remeasured and was virtually identical. The composition was then heated for 14 days at 33° C. and the kinematic viscosity monitored. (see Table 2).

Kinematic viscosity was measured by using a calibrated Cannon-Fenske routine viscometer size 500.

TABLE 2

| Time (Days) | Kinematic Viscosity (cSt) | Kinematic viscosity change (%) |
| --- | --- | --- |
| 0 | 1343 | 0.00 |
| 4 | 1377 | 2.53 |
| 6 | 1385 | 3.13 |
| 8 | 1419 | 5.68 |
| 11 | 1467 | 9.22 |
| 14 | 1494 | 11.21 |

The compositions of this example showed only a small change in viscosity with heating.

COMPARATIVE EXAMPLE 5

The composition of Comparative Example 3 was tested for stability in the same manner as in Example 11 except that the size of calibrated Cannon-Fenske routine viscometer was 600. The kinematic viscosity was measured a few minutes after filtration and found to be 1850 cSt. After standing for 24 hours at room temperature the kinematic viscosity was remeasured and found to have increased to 3004 cSt. The composition was heated for 14 days at 33° C. and the kinematic viscosity monitored. (see Table 2).

TABLE 3

| Time (Days) | Kinematic viscosity (cSt) | Kinematic viscosity change (%) |
| --- | --- | --- |
| 0 | 3304 | 0 |
| 4 | 4003 | 21.16 |
| 7 | 4407 | 33.38 |
| 11 | 5062 | 53.21 |
| 14 | 5079 | 53.72 |

The composition of Comparative Example 4 showed a large change in kinematic viscosity with heating. The results from Comparative Examples 3, 4 and 5 and Example 11 indicate that adhesion promoters can adversely affect the stability of compositions and that the choice of adhesion promoters that pass the adhesion test and stability tests are not obvious. The comparison of Example 11 and Comparative Example 5 also shows that adhesion promoter may have a surprisingly large effect on the initial kinematic viscosity of photosensitive composition. Adhesion promoters which lower the viscosity are easier to filter and manipulate. It is not obvious which adhesion promoters will lower viscosity of the composition and which will raise the viscosity of the composition.

EXAMPLE 12

3 ml of the composition from Example 11 (or 4) was spin coated at 1700 revolutions per minute onto a silicon wafer and then baked on a hotplate for 3 minutes at 120° C. to yield a 12.38 μm thick film as measured by a profilometer. Segments of the wafers were then exposed at various levels of exposure energy using a Cannon 4000 IE i-line stepper. The wafers were then developed in OPD 4262. The wafers were developed by streaming developer onto the wafer surface and developing for 41.5 seconds. The developer was spun off the film for a few seconds, and then fresh developer streamed onto the wafer. The film was then developed for an additional 41.5 seconds and the developer spun off. The wafer was then rinsed with DI $H_2O$ for 12 seconds while spinning at 1000 rpm, followed by a 10 second, 3500 rpm drying step. The Exposure energy required to clear all the material from an exposed area was observed and reported as $E_0$=180 mJ/cm². The unexposed film thickness as measured with the profilometer was 7.39 μm.

COMPARATIVE EXAMPLE 6

The composition of Comparative Example 6 was identical to those of Examples 2–9 with the exception that the adhesion promoter was one having Structure XIII. This

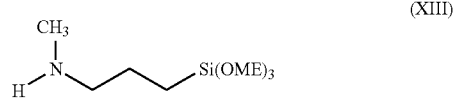
(XIII)

composition was tested in the identical manner as described in Example 12. The exposure energy required to clear all the material from an exposed area was observed and reported as $E_0$=780 mJ/cm². The unexposed film thickness as measured with the profilometer was 7.99 μm.

The results from Comparative Example 6 and Example 12 show that the adhesion promoter can have a significant and surprising effect on the photospeed of the composition.

EXAMPLE 13

40 parts polymer obtained in Synthesis Example 8, 15 parts of Bisphenol AP PAC, 2 parts of diphenylsilanediol and 2.0 parts of gamma-mercaptopropyltrimethoxysilane were dissolved in NMP and filtered. The formulation was spin coated at 1650 revolutions per minute on a silicon wafer then baked on a hotplate for 4 minutes at 120° C., resulting in a film thickness of 14.16 μm as measured by a profilometer. The film was then exposed utilizing an i-line stepper in an open frame exposure array, which incrementally increased exposure energy 25 mJ/cm² with a starting exposure energy of 700 mJ/cm². The wafer was then developed with two 40 second puddles with a 0.262N aqueous solution of tetramethyl ammonium hydroxide, resulting in an array of exposed boxes that were either clear of or containing residual photosensitive composition. These boxes were visually inspected for the exposure energy at which the photosensitive composition was completely cleared from the exposed areas. The formulation cleared boxes at a dose of 1050 mJ/cm². The unexposed film thickness decreased to 6.7 microns.

EXAMPLE 14

40 parts polymer obtained in Synthesis Example 10, 13 parts of Bisphenol AP PAC, 4 parts of diphenylsilanediol and 4.0 parts of triethoxysilylpropylethylcarbamate dissolved in NMP and filtered. The formulation was spin coated at 1600 revolutions per minute on a silicon wafer then baked on a hotplate for 4 minutes at 120° C., resulting in a film thickness of 14.25 µm as measured by a profilometer. The film was then exposed utilizing an i-line stepper in an open frame exposure array, which incrementally increased exposure energy 20 mJ/cm² with a starting exposure energy of 500 mJ/cm². The wafer was then developed with two 10 second puddles with a 0.262N aqueous solution of tetramethyl ammonium hydroxide, resulting in an array of exposed boxes that were either clear of or containing residual photosensitive composition. These boxes were visually inspected for the exposure energy at which the photosensitive composition was completely cleared from the exposed areas. The formulation cleared boxes at a dose of 550 mJ/cm². The unexposed film thickness decreased to 9.68 microns.

EXAMPLE 15

The following positive acting photosensitive composition was prepared: 100 parts of polymer obtained in Synthesis Example 4, 21.7 parts of bisphenol AP PAC-1D,

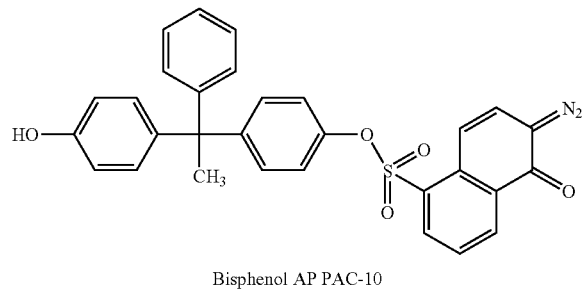

Bisphenol AP PAC-10 and 5 parts of diphenylsilane diol were dissolved in GBL and filtered. 3 ml of this composition was spin coated on to a quartz slide and then baked on a hotplate for 3 minutes at 120° C. to yield a 3.88 µm thick film. The wafers were then cured in a vacuum oven under an N2 purge. The oven cure program started at 100° C. and increased at a rate of 5° C. per minute up to 350° C. The cure was held at 350° C. for 1 hour then cooled down to 100° C. over 2 hours. The cured film thickness was measured at 2.93 µm. The color of this film was light yellow.

EXAMPLE 16

The following positive acting photosensitive composition is prepared: 100 parts of polymer obtained in Synthesis Example 4, 11.9 parts of bisphenol AP PAC,

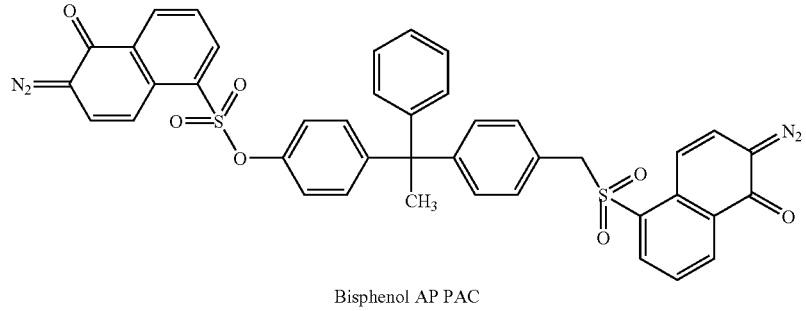

Bisphenol AP PAC and 5 parts of diphenylsilane diol are dissolved in GBL and filtered. A silicon wafer is cleaned by O₂ plasma in Mercator Life Systems apparatus (500 watts, 0.3–0.5 torr) for 10 min. This wafer is primed with external adhesion promoter gamma-aminopropyl triethoxy silane by dispensing about 1 to about 3 mL of 1% (wt) solution of gamma-aminopropyl triethoxy silane in ethanol on the wafer and spin-drying the wafer at 4000 rpm for 45 sec. 3 ml of the composition is spin coated at about 1700 revolutions per minute onto a silicon wafer and then baked on a hotplate for about 3 minutes at about 120° C. to yield an approximately 12.4 µm thick film as measured by a profilometer. Segments of the wafers are then exposed at various levels of exposure energy using a Cannon 4000 IE i-line stepper. The wafers are then developed in OPD 4262. The wafers are developed by streaming developer onto the wafer surface and developing for about 41.5 seconds. The developer is spun off the film for a few seconds, and then fresh developer streamed onto the wafer. The film is then developed for an additional 41.5 seconds and the developer is spun off. The wafer is then rinsed with DI H₂O for about 12 seconds while spinning at about 1000 rpm, followed by about a 10 second drying step by spinning the wafer at 3500 rpm. The Exposure energy required to clear all the material from an exposed area is about 180 mJ/cm². The unexposed film thickness as measured with the profilometer is about 7.4 µm. The produced patterns are cured and exposed to the pressure cooker test described in Example 2 for 1000 hours. The cured photosensitive compositions color is light and the composition passes the adhesion test.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A positive photosensitive resin composition comprising:

(a) at least one polybenzoxazole precursor polymer having structure I or II;

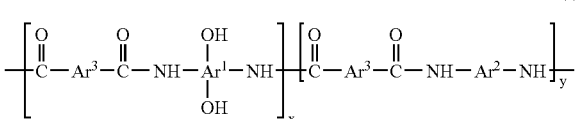

(I)

-continued

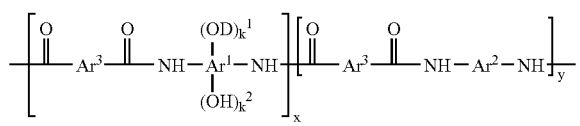
(II)

wherein $Ar^1$ is selected from the group consisting of a tetravalent aromatic group, a tetravalent heterocyclic group, or mixtures thereof; $Ar^2$ is selected from the group consisting of a divalent aromatic, a divalent heterocyclic, a divalent alicyclic, or a divalent aliphatic group that may contain silicon or mixtures thereof; $Ar^3$ is selected from the group consisting of a divalent aromatic group or a divalent aliphatic group, a divalent heterocyclic group, or mixtures thereof; D is selected from the group consisting of one of the following moieties:

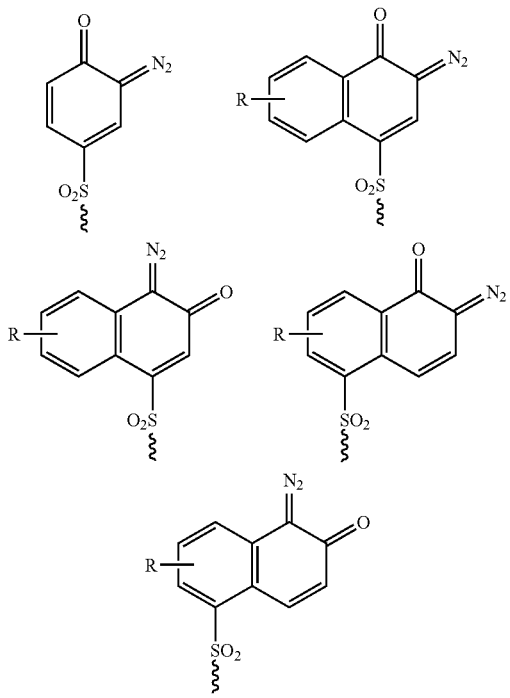

wherein R is selected from the group consisting of H, halogen, a $C_1$–$C_4$ alkyl group, a $C_1$–$C_4$ alkoxy group, or a $C_5$–$C_7$ cycloalkyl group; $k^1$ can be any positive value of up to about 0.5, $k^2$ can be any value from about 1.5 to about 2, with the proviso that $(k^1+k^2)=2$, x is from about 10 to about 1000; y is from about 0 to about 900;

(b) at least one photosensitive compound selected from the group consisting of compounds described by structures III–V,

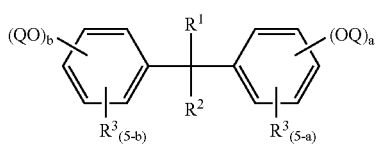
(III)

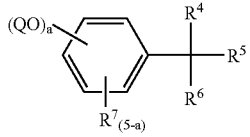
(IV)

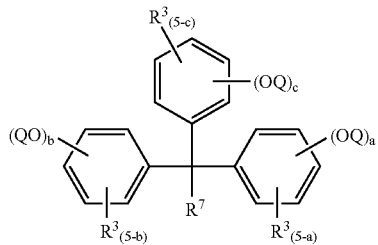
(V)

wherein $R^1$, $R^2$, $R^4$, $R^5$, $R^6$ and $R^7$ each independently are selected from the group consisting of a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently selected from the group consisting of H, a linear or branched $C_1$–$C_4$ alkyl group, a halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group or a phenyl or alkyl or halide substituted phenyl group; Q is selected from the group consisting of H or D with the proviso that at least one Q=D; D is as defined hereinbefore; a is an integer from 1 to 5; b and c are integers from 0 to 5 with the provisos (1) that for Structure III, if $a=b=1$ and both OQ are substituted para to the $R^1R^2C$ substituent, then both $R^1$ and $R^2$ are not simultaneously methyl and (2) $1<=a+b<6$; and the proviso that for Structure V, if $a=b=c=1$ and all OQ are para to the triphenyl methane carbon substituent, then at least one $R^3$ is not H;

(c) at least one solvent; and (d) optionally an adhesion promoter.

2. A positive photosensitive composition according to claim 1, wherein $Ar^1$ in Structure I and II is a moiety selected from the group consisting of

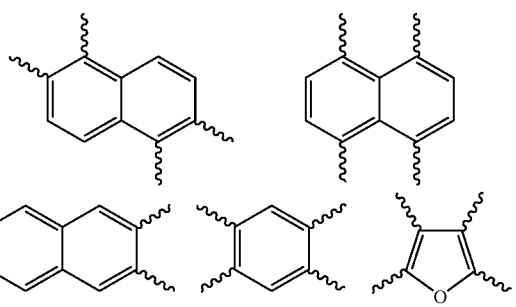

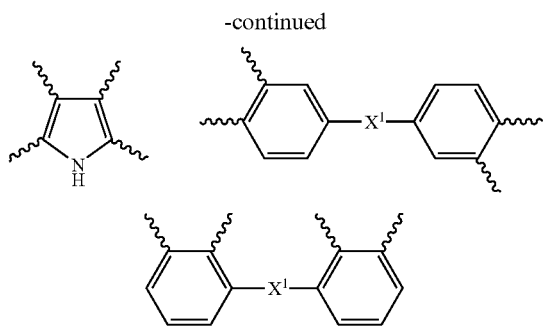

wherein $X^1$ is selected from the group consisting of —O—, —S—, —C(CF$_3$)$_2$—, —CH$_2$—, —SO$_2$—, —NHCO— or —SiR$^8_2$— and each $R^8$ is independently selected from the group consisting of a $C_1$–$C_7$ linear or branched alkyl or $C_5$–$C_8$ cycloalkyl group.

3. A positive photosensitive composition according to claim 1, wherein $Ar^1$ in Structure I and II is

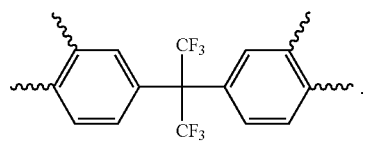

4. A positive photosensitive composition according to claim 1, wherein $Ar^2$ in Structure I and II is a moiety selected from the group consisting of

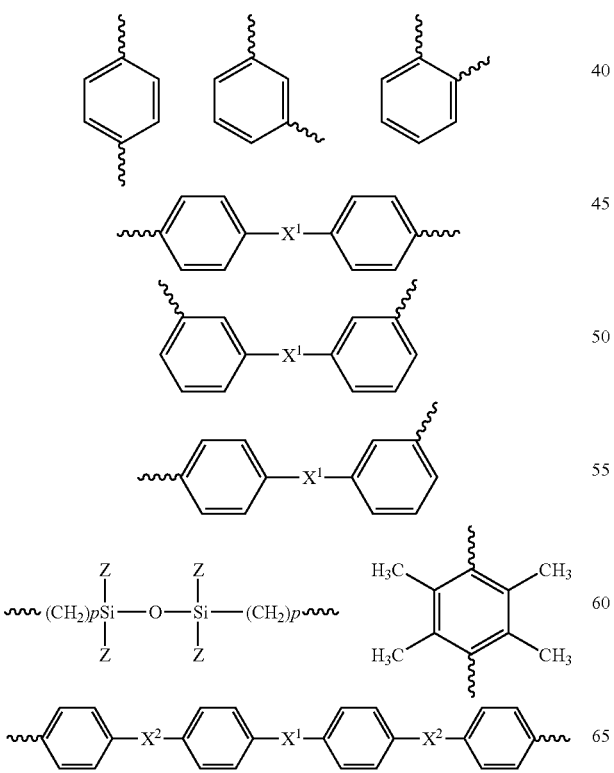

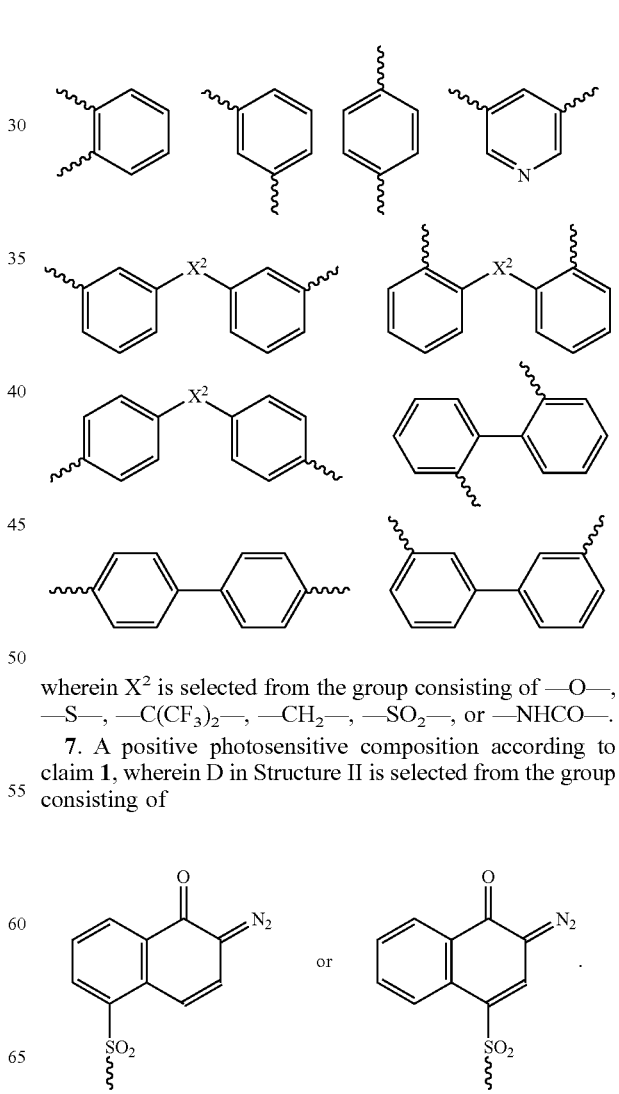

wherein $X^1$ is selected from the group consisting of —O—, —S—, —C(CF$_3$)$_2$—, —CH$_2$—, —SO$_2$—, —NHCO— and —SiR$^8_2$—, $X^2$ is selected from the group consisting of —O—, —S—, —C(CF$_3$)$_2$—, —CH$_2$—, —SO$_2$—, and —NHCO—, Z=H or a $C_1$–$C_8$ linear, branched or cyclic alkyl group, p is an integer from 1 to 6, and each $R^8$ is independently selected from the group consisting of a $C_1$–$C_7$ linear or branched alkyl and $C_5$–$C_8$ cycloalkyl group.

5. A positive photosensitive composition according to claim 4 wherein Z is selected from the group consisting of methyl, ethyl, propyl, iso-propyl, n-butyl, sec-butyl, t-butyl, n-octyl, cyclopentyl, cyclohexyl, and cyclooctyl.

6. A positive photosensitive composition according to claim 1, wherein $Ar^3$ in Structures I and II is a moiety selected from the group consisting of wherein $X^2$ is selected from the group consisting of —O—, —S—, —C(CF$_3$)$_2$—, —CH$_2$—, —SO$_2$—, or —NHCO—.

7. A positive photosensitive composition according to claim 1, wherein D in Structure II is selected from the group consisting of 8. A positive photosensitive composition according to claim 1, wherein the polybenzoxazole precursor polymer has structure II.

9. A positive photosensitive composition according to claim 1, wherein the amount of polybenzoxazole precursor polymer of Structures I or II in the photosensitive composition is from about 2.5 wt. % to about 45 wt. %.

10. A positive photosensitive composition according to claim 1, wherein the amount of polybenzoxazole precursor polymer of Structures I or II in the photosensitive composition is from about 15 wt. % to about 40 wt. %.

11. A positive photosensitive composition according to claim 1, wherein the amount of polybenzoxazole precursor polymer of Structures I or II in the photosensitive composition is from about 25 wt. % to about 35 wt. %.

12. A positive photosensitive composition according to claim 1, wherein the photosensitive compound (b) is selected from the group consisting of

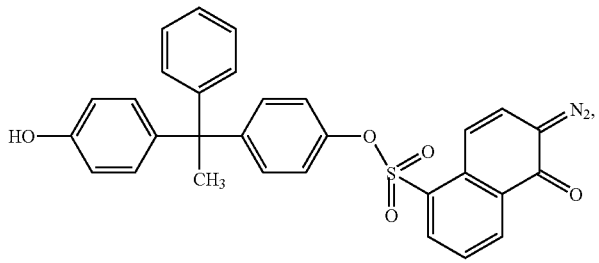

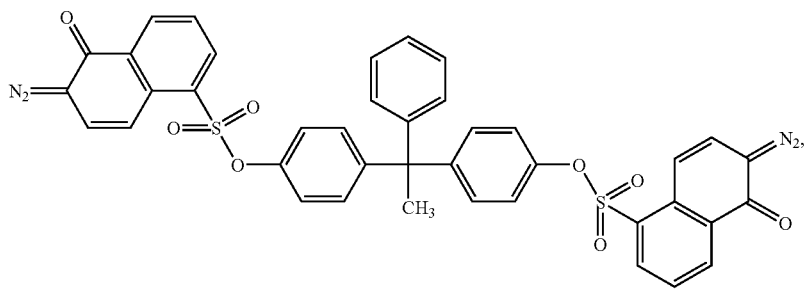

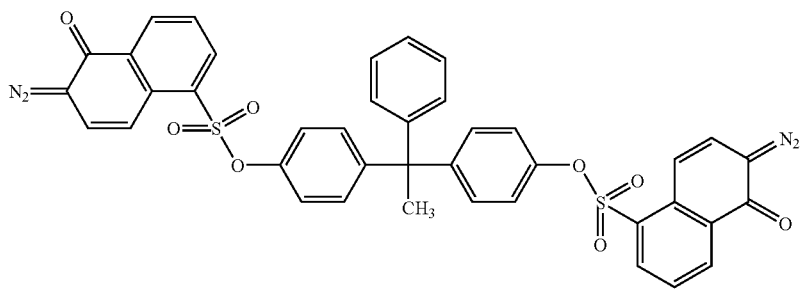

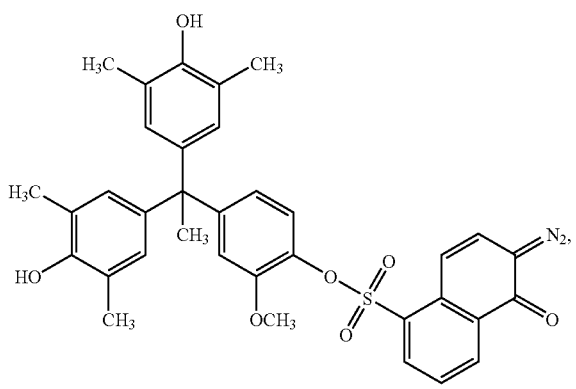

-continued
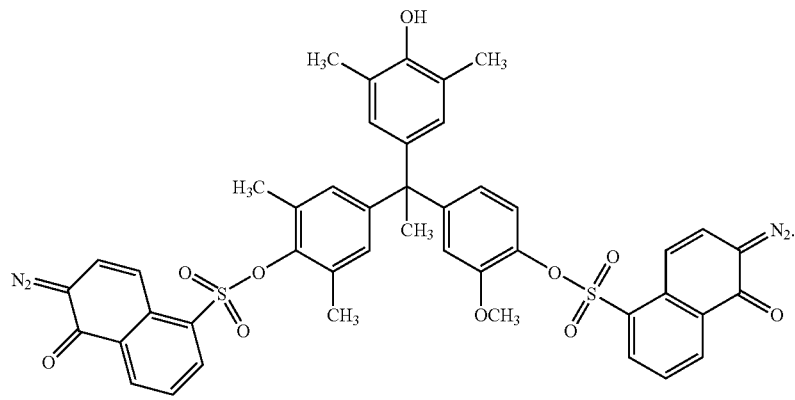
13. A positive photosensitive composition according to claim 1, wherein the photosensitive compound (b) is selected from the group consisting of
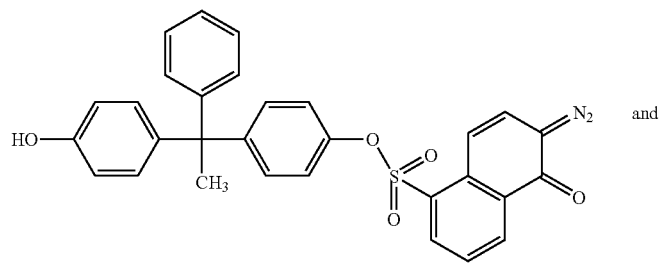 and
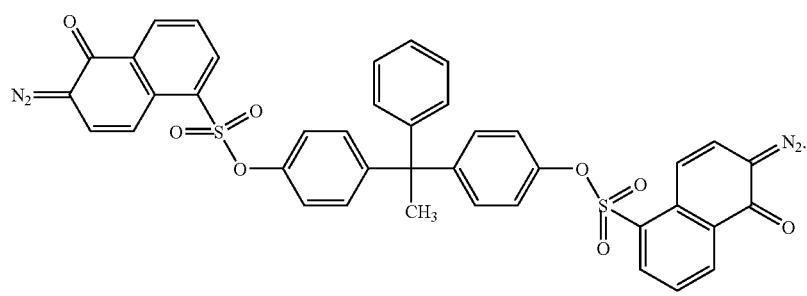
14. A positive photosensitive composition according to claim 1, wherein the photosensitive compound (b) is
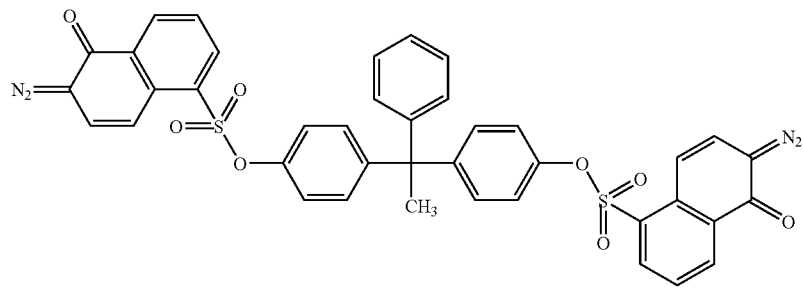

15. A positive photosensitive composition according to claim 1, wherein the adhesion promoter is described by Structure IX

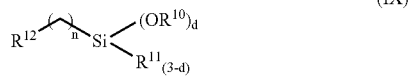

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6. $R^{12}$ is selected from the group consisting of one of the following moieties:

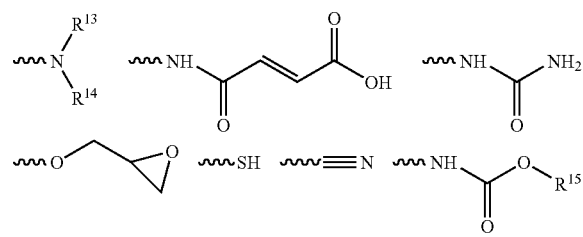

wherein each $R^{13}$ and $R^{14}$ are independently selected from the group consisting of a $C_1$–$C_4$ alkyl group and a $C_5$–$C_7$ cycloalkyl group, and $R^{15}$ is selected from the group consisting of a $C_1$–$C_4$ alkyl group and a $C_5$–$C_7$ cycloalkyl group.

16. A positive photosensitive composition according to claim 15, wherein the $R^{12}$ is selected from the group consisting of

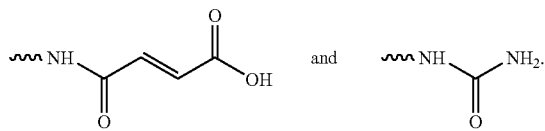

17. A positive photosensitive composition according to claim 15, wherein adhesion promoter is selected from the group consisting of

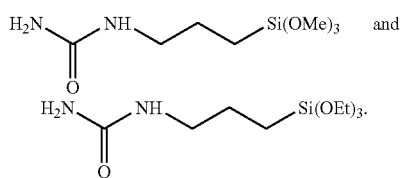

18. A positive photosensitive composition according to claim 1, wherein the amount of adhesion promoter of in the photosensitive composition is from about 0.1 wt. % to about 10 wt. %.

19. A positive photosensitive composition according to claim 1, wherein the amount of adhesion promoter in the photosensitive composition is from about 0.3 wt. % to about 5 wt. %.

20. A positive photosensitive composition according to claim 1, wherein the amount of adhesion promoter in the photosensitive composition is from about 0.5 wt. % to about 2.5 wt. %.

21. A positive photosensitive composition of claim 1, wherein the polybenzoxazole precursor polymer is a polymer of structure II and wherein the D in the polymer structure is selected from the group consisting of

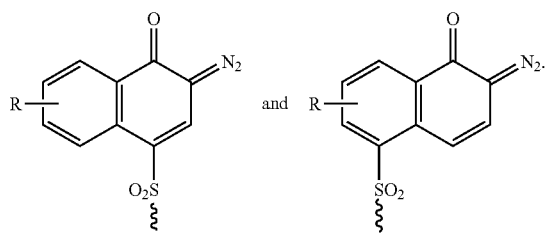

and the photosensitive compound (b) is a compound having the structure V.

22. A positive photosensitive composition of claim 21 wherein an adhesion promoter is present in the composition.

23. A positive photosensitive composition of claim 22 wherein the adhesion promoter is described by Structure IX

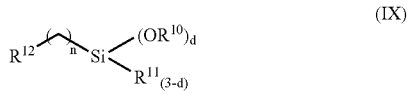

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6 and $R^{12}$ is selected from the group consisting of one of the following moieties:

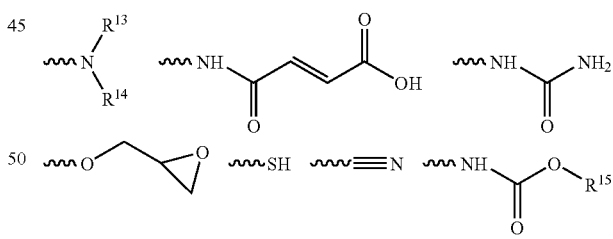

wherein each $R^{13}$ and $R^{14}$ are independently selected from the group consisting of a $C_1$–$C_4$ alkyl group and a $C_5$–$C_7$ cycloalkyl group, and $R^{15}$ is selected from the group consisting of a $C_1$–$C_4$ alkyl group and a $C_5$–$C_7$ cycloalkyl group.

24. A process for forming a relief pattern on a substrate, the process comprises the steps of:
  (a) coating on a suitable substrate, a positive-working photosensitive composition of claim 1, thereby forming a coated substrate;
  (b) prebaking the coated substrate;
  (c) exposing the prebaked coated substrate to actinic radiation;

(d) developing the exposed coated substrate with an aqueous developer, thereby forming an uncured relief image on the coated substrate; and
(e) baking the developed coated substrate at an elevated temperature, thereby curing the relief image.

25. A process for forming a relief pattern on a substrate, the process comprises the steps of:
    (a) coating on a suitable substrate, a positive-working photosensitive composition of claim 2, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

26. A process for forming a relief pattern on a substrate, the process comprises the steps of:
    (a) coating on a suitable substrate, a positive-working photosensitive composition of claim 3, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

27. A process for forming a relief pattern on a substrate, the process comprises the steps of:
    (a) coating on a suitable substrate, a positive-working photosensitive composition of claim 4, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

28. A process for forming a relief pattern on a substrate, the process comprises the steps of:
    (a) coating on a suitable substrate, a positive-working photosensitive composition of claim 5, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

29. A process for forming a relief pattern on a substrate, the process comprises the steps of:
    (a) coating on a suitable substrate, a positive-working photosensitive composition of claim 6, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

30. A process for forming a relief pattern on a substrate, the process comprises the steps of:
    (a) coating on a suitable substrate, a positive-working photosensitive composition of claim 7, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

31. A process for forming a relief pattern on a substrate, the process comprises the steps of:
    (a) coating on a suitable substrate, a positive-working photosensitive composition of claim 8, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

32. A process for forming a relief pattern on a substrate, the process comprises the steps of:
    (a) coating on a suitable substrate, a positive-working photosensitive composition of claim 9, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

33. A process for forming a relief pattern on a substrate, the process comprises the steps of:
    (a) coating on a suitable substrate, a positive-working photosensitive composition of claim 10, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

34. A process for forming a relief pattern on a substrate, the process comprises the steps of:
    (a) coating on a suitable substrate, a positive-working photosensitive composition of claim 11, thereby forming a coated substrate;
    (b) prebaking the coated substrate;
    (c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

35. A process for forming a relief pattern on a substrate, the process comprises the steps of:
    (a) coating on a suitable substrate, a positive-working photosensitive composition of claim 12, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

36. A process for forming a relief pattern on a substrate, the process comprises the steps of:
    (a) coating on a suitable substrate, a positive-working photosensitive composition of claim 13, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

37. A process for forming a relief pattern on a substrate, the process comprises the steps of:
    (a) coating on a suitable substrate, a positive-working photosensitive composition of claim 14, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

38. A process for forming a relief pattern on a substrate, the process comprises the steps of:
    (a) coating on a suitable substrate, a positive-working photosensitive composition of claim 15, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

39. A process for forming a relief pattern on a substrate, the process comprises the steps of:
    (a) coating on a suitable substrate, a positive-working photosensitive composition of claim 16, thereby forming a coated substrate;
    (b) prebaking the coated substrate;
    (c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

40. A process for forming a relief pattern on a substrate, the process comprises the steps of:
    (a) coating on a suitable substrate, a positive-working photosensitive composition of claim 17, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

41. A process for forming a relief pattern on a substrate, the process comprises the steps of:
    (a) coating on a suitable substrate, a positive-working photosensitive composition of claim 18, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

42. A process for forming a relief pattern on a substrate, the process comprises the steps of:
    (a) coating on a suitable substrate, a positive-working photosensitive composition of claim 19, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

43. A process for forming a relief pattern on a substrate, the process comprises the steps of:
    (a) coating on a suitable substrate, a positive-working photosensitive composition of claim 20, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

44. A process for forming a relief pattern on a substrate, the process comprises the steps of:
    (a) coating on a suitable substrate, a positive-working photosensitive composition of claim 21, thereby forming a coated substrate;
    (b) prebaking the coated substrate;
    (c) exposing the prebaked coated substrate to actinic radiation;

(d) developing the exposed coated substrate with an aqueous developer, thereby forming an uncured relief image on the coated substrate; and
(e) baking the developed coated substrate at an elevated temperature, thereby curing the relief image.

45. A process for forming a relief pattern on a substrate, the process comprises the steps of:
    (a) coating on a suitable substrate, a positive-working photosensitive composition of claim 22, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

46. A process for forming a relief pattern on a substrate, the process comprises the steps of:
    (a) coating on a suitable substrate, a positive-working photosensitive composition of claim 23, thereby forming a coated substrate;
    (b) prebaking the coated substrate;
    (c) exposing the prebaked coated substrate to actinic radiation;
    (d) developing the exposed coated substrate with an aqueous developer, thereby forming an uncured relief image on the coated substrate; and
    (e) baking the developed coated substrate at an elevated temperature, thereby curing the relief image.

47. A process according to claim 24, wherein the suitable substrate to be coated with the positive-working photosensitive composition in step (a) is a substrate that has been treated with an external adhesion promoter.

48. A process according to claim 47 wherein the external adhesion promoter is selected from the group consisting of vinylalkoxysilanes, methacryloxalkoxyysilanes, mercaptoalkoxysilanes, aminoalkoxysilanes, epoxyalkoxysilanes and glycidoxyalkoxysilanes.

49. A process according to claim 48 wherein the external adhesion promoter is selected from the group consisting of gamma-aminopropyltrimethoxy-silane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane.

50. A process according to claim 49 wherein the external adhesion promoter is gamma-Aminopropyltrimethoxysilane.

51. A substrate having a patterned image produced by the process of claim 24.

52. A substrate having a patterned image produced by the process of claim 30.

53. A substrate having a patterned image produced by the process of claim 35.

54. A substrate having a patterned image produced by the process of claim 38.

55. A substrate having a patterned image produced by the process of claim 44.

56. A substrate having a patterned image produced by the process of claim 45.

57. A substrate having a patterned image produced by the process of claim 46.

58. A substrate having a patterned image produced by the process of claim 47.

* * * * *

UNITED STATES PATENT AND TRADEMARK OFFICE
CERTIFICATE OF CORRECTION

PATENT NO. : 7,195,849 B2
APPLICATION NO. : 10/793341
DATED : March 27, 2007
INVENTOR(S) : Naiini et al.

It is certified that error appears in the above-identified patent and that said Letters Patent is hereby corrected as shown below:

Column 38, Line 20
Delete "wherein $R^1$, $R^2$, $R^4$, $R^5$, $R^6$ and $R^7$ each independently are selected from the group consisting of a linear or branched $C_1$ - $C_4$ alkyl group, a phenyl or halide substituted $C_1$ - $C_4$ linear or branched alkyl group, a perfluorinated $C_1$ - $C_4$ linear or branched alkyl group, a $C_5$ - $C_7$ cycloalkyl group, a $C_1$ - $C_4$ alkyl or halide substituted $C_5$ - $C_7$ cycloalkyl group,"

insert -- wherein $R^2$, $R^4$, $R^5$, $R^6$ and $R^7$ each independently are selected from the group consisting of a linear or branched $C_1$ - $C_4$ alkyl group, a phenyl or halide substituted $C_1$ - $C_4$ linear or branched alkyl group, a perfluorinated $C_1$ - $C_4$ linear or branched alkyl group, a $C_5$ - $C_7$ cycloalkyl group, and a $C_1$ - $C_4$ alkyl or halide substituted $C_5$ - $C_7$ cycloalkyl group, $R^1$ is selected from the group consisting of an ethyl group, an isopropyl group, a t-butyl group, a phenyl or halide substituted $C_1$ - $C_4$ linear or branched alkyl group, a perfluorinated $C_1$ - $C_4$ linear or branched alkyl group, a $C_5$ - $C_7$ cycloalkyl group, and a $C_1$ - $C_4$ alkyl or halide substituted $C_5$ - $C_7$ cycloalkyl group, --

Signed and Sealed this

Fifth Day of October, 2010

David J. Kappos
*Director of the United States Patent and Trademark Office*